(12) United States Patent
Fan et al.

(10) Patent No.: US 9,941,895 B2
(45) Date of Patent: Apr. 10, 2018

(54) TIME DELAY IN DIGITALLY OVERSAMPLED SENSOR SYSTEMS, APPARATUSES, AND METHODS

(71) Applicant: KOPIN CORPORATION, Westborough, MA (US)

(72) Inventors: Dashen Fan, Bellevue, WA (US); Joseph Yong Kwon, San Jose, CA (US)

(73) Assignee: KOPIN CORPORATION, Westborough, MA (US)

( * ) Notice: Subject to any disclaimer, the term of this patent is extended or adjusted under 35 U.S.C. 154(b) by 0 days.

(21) Appl. No.: 15/225,745

(22) Filed: Aug. 1, 2016

(65) Prior Publication Data

US 2018/0034470 A1 Feb. 1, 2018

(51) Int. Cl.
*H03M 1/12* (2006.01)
*H04B 7/06* (2006.01)

(52) U.S. Cl.
CPC ........ *H03M 1/1245* (2013.01); *H04B 7/0617* (2013.01)

(58) Field of Classification Search
CPC ............................ H03M 1/1245; H04B 7/0617
USPC .................................................. 341/122–155
See application file for complete search history.

(56) References Cited

U.S. PATENT DOCUMENTS

2010/0271957 A1* 10/2010 Stapleton .............. H03F 1/3247
370/242
2014/0009564 A1* 1/2014 Cleve ..................... H04M 3/002
348/14.08

OTHER PUBLICATIONS

Notification Of Transmittal of The International Search Report and Wreen Opinion for Application PCT/US2017/015882, Internationai Filing Date Jan. 31, 2017 (6 pages).
Written Opinion Of The International Searching Authority for Application PCT/US2017/015882, International Filing Date Jan. 31, 2017 (12 pages).

* cited by examiner

*Primary Examiner* — Lam T Mai
(74) *Attorney, Agent, or Firm* — Peloquin, PLLC; Mark S. Peloquin, Esq.

(57) ABSTRACT

Systems and methods are described to time delay a signal output from an analog-to-digital converter (ADC). The ADC includes a digital sensor responsive to an analog field quantity. The digital sensor is configured to output an oversampled digital output signal at a sampling clock frequency. A time delay element is configured to receive as an input, the oversampled digital output signal and to output a time delayed oversampled digital output signal. A filter is configured to receive as an input the delayed oversampled digital output signal. The filter low pass filters and decimates to a lower sample rate the delayed oversampled digital output signal. An output includes a low pass filtered decimated delayed digital output signal, where the lower sample rate is less than the sampling clock frequency.

54 Claims, 18 Drawing Sheets

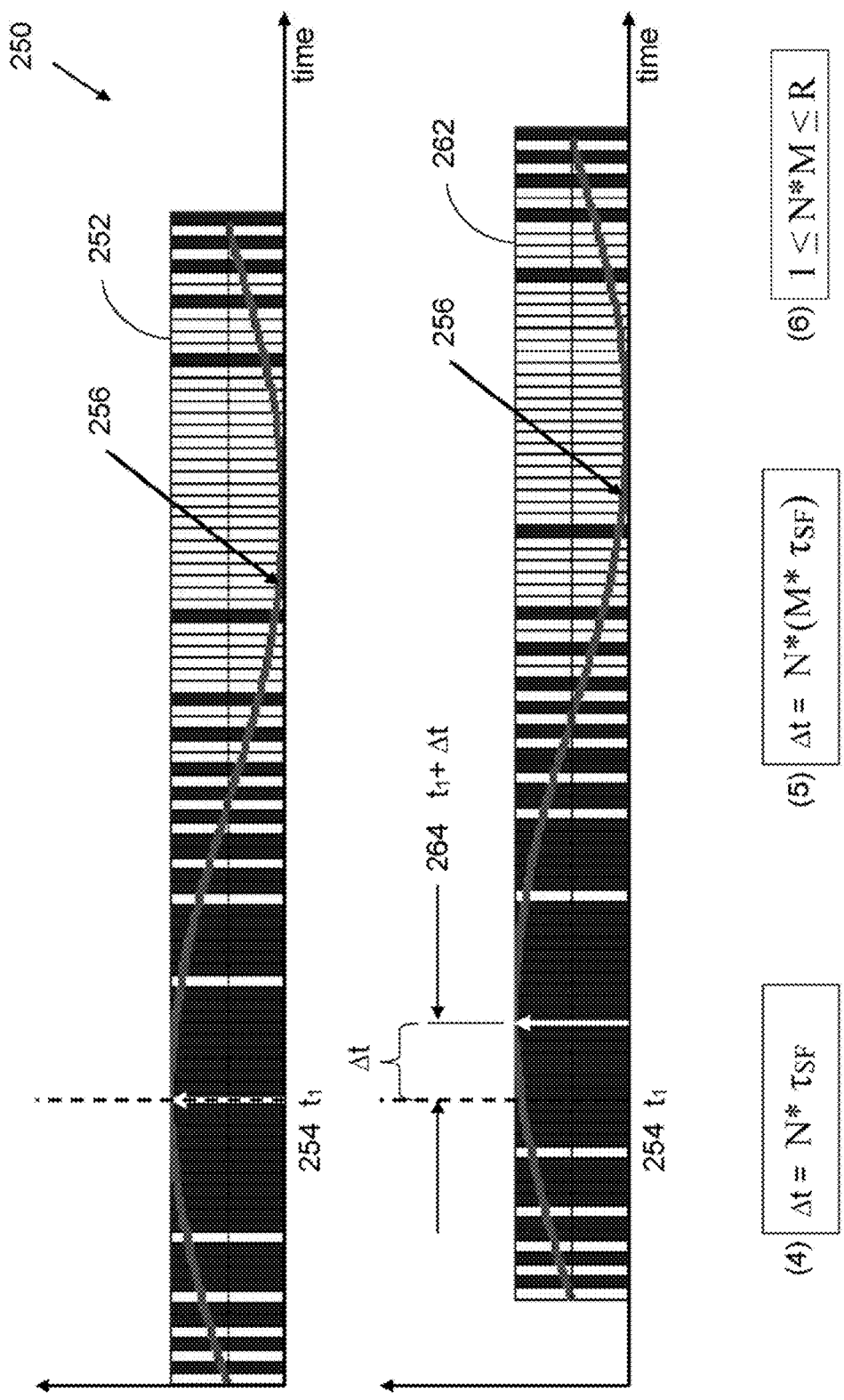

$$(7)\quad \Delta t = \tau = 1/f$$

$$(8)\quad \Delta t_{\text{integer delay}} = 1/f_{\text{bb}}$$

$$(9)\quad \Delta t_{\text{fractional delay}} = 1/f_{\text{SF}}$$

$$(10)\quad \frac{1}{R} = \frac{\Delta t_{\text{fractional delay}}}{\Delta t_{\text{integer delay}}}$$

$$(11)\quad \Delta t_{\text{fractional delay}} = \frac{\Delta t_{\text{integer delay}}}{R}$$

FIGURE 11A

TIME DELAY IN DIGITALLY OVERSAMPLED SENSOR SYSTEMS, APPARATUSES, AND METHODS

BACKGROUND OF THE INVENTION

1. Field of Invention

The invention relates generally to sampled systems more specifically to time delay in digitally oversampled sensor systems, apparatuses, and methods.

2. Art Background

Field quantities which exist in the natural world are generally analog signals which have continuously varying amplitude as a function of time. Examples of these field quantities are sound pressure, vibration, light, etc. Measurement of a field quantity is accomplished with an analog sensor or a digital sensor. Digital electronics work with digital signals. Interfacing analog signals with digital electronics presents a technical problem for which a technical solution using a technical means is needed.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

FIG. 2B illustrates two signals from FIG. 2A, according to embodiments of the invention.

FIG. 11A and 11B illustrate increased resolution provided by a fractional delay, according to embodiments of the invention.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

Systems and methods are described for applying a time delay to an oversampled digital signal. In various embodiments the time delay is applied in various locations within the oversampled domain of the digital signal during signal processing in an analog-to-digital converter (ADC).

Figure 1:
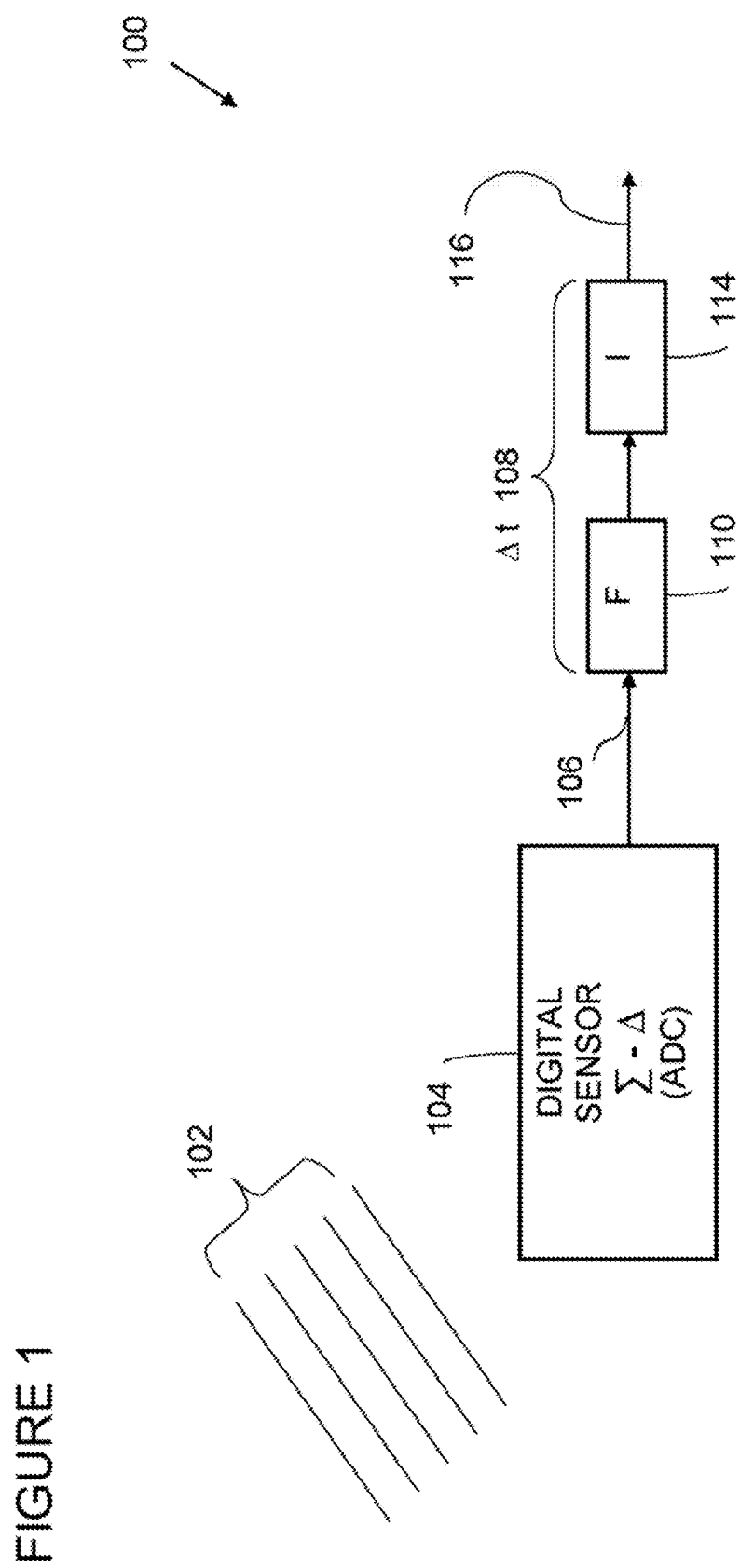
FIG. 1 illustrates a digital sensor system.

FIG. 1 illustrates, generally at 100, a digital sensor system. With reference to FIG. 1, an analog field quantity 102 is sensed by a digital sensor system 104. As represented in FIG. 1 at 104, the digital sensor system includes a digital sensor which is typically configured to oversample the analog signal 102. Within the digital sensor system 104 the oversampled signal is input to a receiver which decimates and low pass filters the oversampled signal in order to output a signal at a baseband sampling rate at 106 which is the digital representation of the analog field quantity 102. A time delay can be imparted to the digital baseband signal at 108. The time delay 108 can be of various lengths and is sometimes expressed in two parts, i.e., an integer part and a fractional part. A first part 114 can be referred to as an integer delay where "integer" refers to an integer number of baseband sampling rate cycles. A second part 110 can be referred to as a fractional delay where "fraction" refers to a fraction of the baseband sampling rate period. A time delayed digital version of the digital signal 106 is output at 116. The time delayed digital signal 116 can be used in various subsequent processes such as beamforming, etc.

Figure 2A:
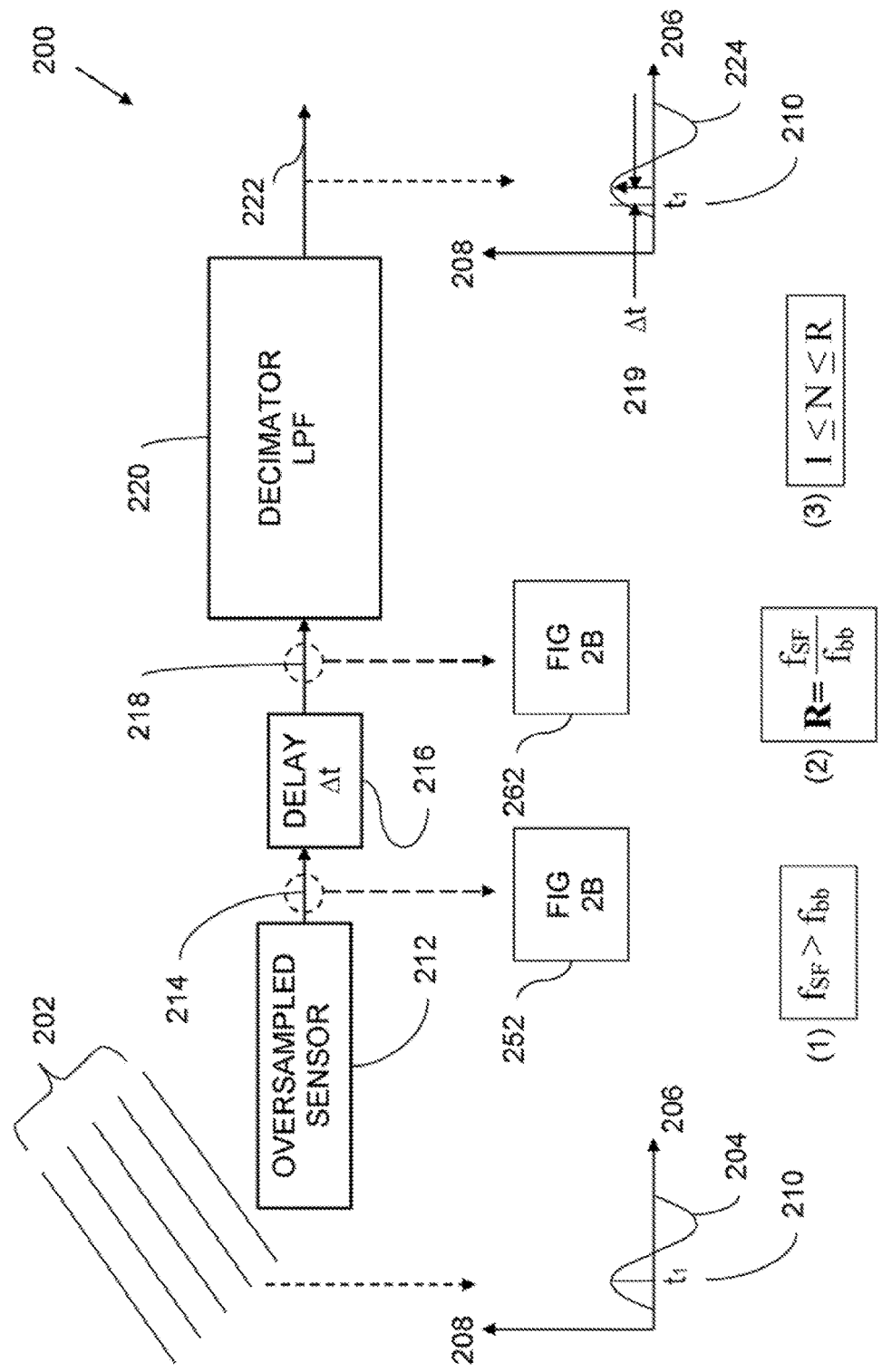
FIG. 2A illustrates time delaying an oversampled signal within an analog-to-digital converter (ADC) system, according to embodiments of the invention.

FIG. 2A illustrates, generally at 200, time delaying an oversampled signal within an analog-to-digital converter (ADC) system, according to embodiments of the invention. With reference to FIG. 2A, a time delay is inserted in the oversampled domain of the ADC. In various embodiments, the time delay is inserted between a digitally oversampled sensor output signal and a receiver used to process the oversampled digital output signal. In operation, an analog field quantity 202 is incident upon a digital sensor 212. The digital sensor 212 converts the incident analog field to an oversampled digital output signal at 214 which preserves phase information of the signal within the bit stream of the signal 214. In various embodiments, the oversampled signal 214 is provided as a pulse density modulated (PDM) signal.

In other embodiments, other digitizing methodologies can be employed to digitize the oversampled signal. The oversampling which occurs in the oversampled sensor 212 occurs at a sampling clock frequency. The sampling clock signal is often provided externally by the data processing system or a dedicated digital signal processing system (DSP) clock which is divided down to the desired sampling clock frequency used to sample the digital sensor 212. In other embodiments, the sampling clock can be provided locally even on the same integrated circuit with a digital sensor.

The oversampled digital signal 214 is input into a delay element 216 and is output at 218 after a time delay "Δt" is imparted to the oversampled digital signal. The time delay Δt imparted to the oversampled digital signal 214 at delay element 216 is represented by an integer number of sampling clock cycles. When it is desirable to impart a "fractional delay" at delay element 216, then the maximum number of sampling clock cycles that would be imparted at 216 is equal to the ratio of sampling clock frequency divided by the baseband sampling rate, indicated herein by the variable "R." R is discussed more completely below in conjunction with the figures that follow. Note that in other embodiments, systems are configured without the constraint R of equation (3). In such cases, the delay imposed by the delay element 216 exceeds the upper limit R of equation (3).

In various embodiments, the delay element 216 is implemented as a buffer, which can be programmable. In other embodiments, the delay element is implemented with a delay line; the delay line can be a programmable delay line. In yet other embodiments, the delay element is implemented with a circuit constructed to provide a delay and the delay can be programmable. A programmable delay element 216 will allow the magnitude of the delay Δt to be adjusted as desired. In the context of beamforming, a programmable delay(s) will allow a beam, formed with two or more sensors, to be steered to different directions. Beamforming will be discussed more completely below in conjunction with the figures that follow.

The output signal from the delay element 216 is a delayed oversampled digital signal 218 which is input into a receiver module 220. The receiver module 220 performs the functions of low pass filtering and decimation. Low pass filtering removes the high frequency noise resulting from the oversampling process and decimation reduces the sampling frequency to a baseband sampling rate. A baseband digital signal is output at 222 from the receiver module 220. The baseband signal 222 is a digital signal having a bandwidth as prescribed by an application of interest and, depending on the digitization methodology, an increased dynamic range relative to the oversampled digital signal 214 output from the digital sensor 212.

As an illustration of a sinusoidal representation of an analog field quantity 204 is illustrated as a function of time 206 and amplitude 208. A marker 210 indicates a peak $t_1$ in the field quantity 204. After the time delay "Δt" is imparted to the oversampled digital signal and the post processing described above in the receiver 220 is performed, for illustration herein, when the signal at 222 is converted back to an analog signal it would appear as illustrated at 224 where the time delayed amplitude 224 is time delayed by Δt resulting in the peak amplitude of the signal 224 delayed to $t_1+\Delta t$ as illustrated at 219. Thus, a time delay is imparted to the oversampled digital signal in the system described above in FIG. 2A. Imparting the time delay is accomplished by insertion of the delay element 216 which can be accomplished, in various embodiments, by inserting, in one embodiment, a buffer as shown between the oversampled digital sensor output 214 and the input to the received module 220. In alternative embodiments, described in the figures that follow, a time delay element will be inserted between stages of a receiver module. Thus, embodiments of the invention are not limited to introduction of the time delay element on the input to the receiver module 220.

In various embodiments, the oversampling performed in the digital sensor 212 is accomplished with a sigma-delta modulator in an analog-to-digital conversion(ADC) process which outputs at 214 a one-bit deep pulse density modulated (PDM) oversampled digital signal representing the digitization of the analog signal 256 (FIG. 2B). Note that for illustration purposes only, without limiting embodiments of the invention, the illustration of the oversampled digital signal 214 is presented at 252 as a pulse density modulated (PDM) signal in the time domain and again in FIG. 2B in enlarged view. At 252 the oversampled digital signal is illustrated with marker 254 indicating a peak of the analog signal 256.

Following application of the time delay Δt, imparted by delay element 216, the time delayed oversampled digital signal 218 is illustrated at 262 with the oversampled digital signal illustrated with marker 254 indicating the peak of the analog signal 256 which has been delayed in time by Δt, the peak is now indicated at 264.

The illustrative example presented with 252, 262, FIG. 2A, and FIG. 2B illustrates oversampling where one wavelength of an analog signal has been sampled one hundred (100) times. No limitation is implied thereby and this example is provided merely for illustration. FIG. 2B illustrates, generally at 250, two signals from FIG. 2A, according to embodiments of the invention.

Referring back to FIG. 2A, as described above the sampling clock frequency is represented by a variable $f_{SF}$; the baseband sampling frequency is given by the variable $f_{bb}$. Equation (1) is the requirement for the oversampling condition where $f_{SF}>f_{bb}$. The ratio of the sampling clock frequency to the baseband sampling frequency is given by equation (2) as $R=f_{SF}/f_{bb}$. In analog-to-digital conversion methodologies that are one-bit deep, R will represent the number of subintervals that a baseband sampling period can be divided into for the purpose of applying a "fractional" time delay to the oversampled digital signal 214. Pulse density modulation (PDM) is such a digital conversion methodology that is one-bit deep where the sign is carried by the bit value where a "1" corresponds to a pulse of plus polarity (+A) and a "0" corresponds with a pulse of negative polarity (−A). Equation (3) indicates that a fractional delay can be selected based on a number of sampling clock cycles N from the range 1≤N≤R, and the time delay which is applied by delay element 216 is given by equation (4) as: $\Delta t=N*T_{SF}$. Where $T_{SF}$ is the period of the sampling clock. Where as described above, "fractional delay" refers to a fraction of a baseband sampling rate cycle.

Note that when other analog-to-digital digitization methodologies are used in the digital sensor 212 the resulting digital bit stream can be other than one-bit deep. In such cases, the oversampled digital signal at 212 can still be delayed with delay element 216, where the delay will be a multiple of a "sample" regardless of how many bits are used to encode the "sample" at the digital sensor 212. The minimum time delay increment will depend on the bit depth of the analog-to-digital digitization methodology used in the digital sensor 212. Thus, equation (4) is modified to equation (5) as follows: $\Delta t=N*(M*\tau_{SF})$. Where $\tau_{SF}$ is the period of the sampling clock, M is the bit depth of the digitization methodology and the product N*M, given by equation (6), which is 1≤N*M≤R with N being an integer subject to the constraint of equation (6) for a fractional delay. Note that in other embodiments, systems are configured without the constraint R of equation (6). In such cases, the delay imposed by the delay element 216 exceeds the upper limit R in equation (6). Thus, a time delay imposed by the system on the oversampled digital signal can be a fraction of a baseband sampling period or greater than the baseband sampling period.

For example, in one non-limiting embodiment, given merely for illustration, a 2-bit amplitude modulated digitization methodology utilizes 2 bits to establish 4 amplitude states for a digital representation of an analog signal. In this example, M=2, which means that a magnitude of the time delay which can be applied to the oversampled digital signal will be an integer number (a multiple) of two successive sampling clock cycles, e.g., 2, 4, 6, 8, etc., thus that the oversampled digital signal is delayed 2 bits at a time in this example of M=2. Introducing a delay of one sampling clock cycle or three sampling clock cycles at 216 when the analog-to-digital encoding methodology is 2 bits deep would introduce noise into the system because 2 successive bits are required to represent the expected value of the analog signal, i.e., a sample.

A variety of different digital sensors can be used at 212. For example, sonic non-limiting examples of sensors used to detect field quantities are sensors used to detect pressure fluctuations such as acoustic pressure fluctuations in air or water. Frequency ranges can range from the low end of the audio spectrum to the ultrasonic range. Sensors can also be used to detect field quantities such as vibration or electromagnetic energy. The following description and the associated figures are set in the context of a digital microphone however; the description is applicable to sensors other than digital microphones and is generally applicable to oversampled sensors used during analog-to-digital conversion (ADC) where a time delay is introduced in the oversampled digital domain.

Figure 2C:
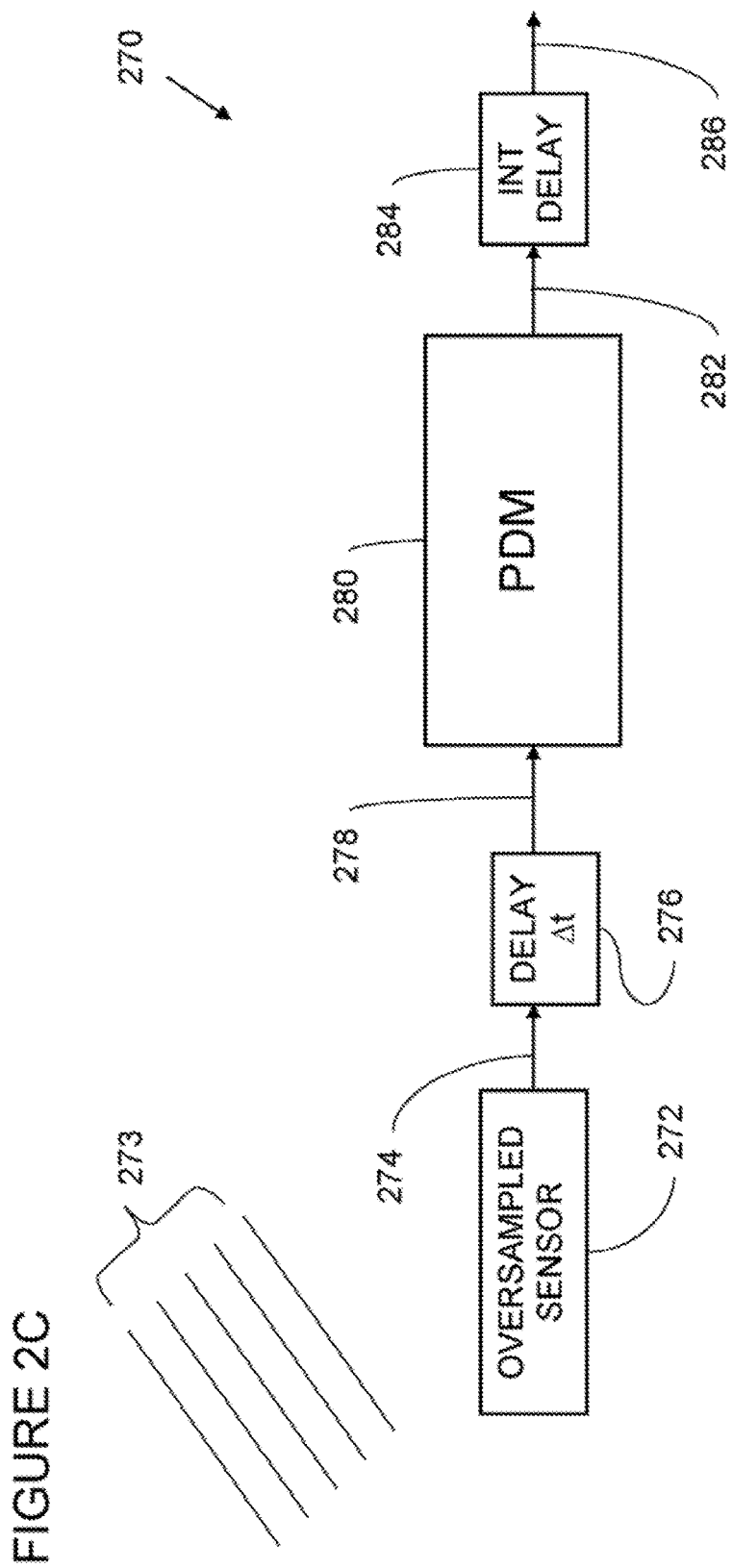
FIG. 2C illustrates an oversampling system utilizing sigma-delta modulation and pulse density modulation (PDM), according to embodiments of the invention.

FIG. 2C illustrates, generally at 270, an oversampling system utilizing sigma-delta modulation and pulse density modulation (PDM), according to embodiments of the invention. With reference to FIG. 2C, a digital microphone is indicated at 272. Digital microphone 272 responds to an acoustic field 273. The digital microphone 272 can take the form of an electret capsule microphone or it can be made using microelectromechanical systems (MEMS) technology as a component on an integrated circuit. In some embodiments, MEMS digital microphones are made as a structure on an integrated circuit which uses a membrane that forms a capacitor with a base plate. Sound waves cause a vibration of the membrane which causes variations in capacitance which are sensed, amplified, and processed in the integrated circuit.

The MEMS digital microphones can be configured with a sigma-delta modulator which produces an oversampled digital output of the analog signal sensed by the microphone. A digital MEMS microphone configured with a sigma-delta modulator is supplied with power and a sampling clock signal. In various embodiments, the digital microphone outputs a pulse density modulated (PDM) oversampled signal. A clock signal can be provided as an external clock signal from a digital data processing system or the sampling clock signal can be provided locally as part of the integrated circuit package that houses the digital microphone. Digital microphones using MEMS technology and sigma-delta modulators for analog-to-digital conversion can be designed to operate at a variety of sampling clock frequencies. Common sampling clock frequencies are in the range of 1 MHz to 5 MHz. The sampling clock frequencies listed here are given merely for illustration and do not limit embodiments of the invention.

Some baseband audio signal applications have established frequency ranges and these ranges together with a desired dynamic range for the audio signal place requirements on the sampling clock frequency used to with the digital microphone 272. For example, telephony, compact disk (CD) format, etc. all have requirements for the baseband audio signal that can be accommodated through embodiments of the invention as described herein. Some non-limiting examples are, for example, pulse code modulated (PCM) audio which can be provided at various dynamic ranges and sample rates, which could be provided at 16 bits per sample at 48 kHz in one or more embodiments. Another non-limiting example is 16 bit CD quality stereo PCM 44.1 kHz. Telephony can be accommodated at different specifications. A non-limiting example is PCM audio at 12 bits per sample at 8 kHz. The foregoing examples of baseband audio formats are provided merely for example and do not limit embodiments of the invention.

The oversampled digital output 274 is input to a delay element 276 as described previously. The delay element 276 applies a time delay to the oversampled digital signal and outputs a time delayed oversampled digital signal at 278.

The oversampled digital signal 278 is input into a PDM receiver module 280. In various embodiments, the PDM receiver module 280 converts an input signal to pulse code modulation (PCM) format and can be alternatively referred to as a PDM to PCM conversion module 280 without limitation to embodiments of the invention. The PDM receiver module 280 decimates and low pass filters the time delayed oversampled digital signal 278 and outputs a time delayed PCM baseband digital signal at 282. Those of ordinary skill in the art will recognize that PCM format is a digital data format in use with digital signals such as digital audio signals. PDM receiver modules such as 280, as well as other receiver modules described in the other figures in this description of embodiments, can be implemented with conversion to a format other than PCM format and the description given herein with conversion to PCM format does not impose any limitation on embodiments of the invention.

As described above, the time delay element 276 can apply a fractional time delay to the oversampled digital signal 274. In some embodiments, the system design is such that a total time delay applied to the baseband signal 286 is made up from the fractional delay contribution at 276 and an integer delay contribution at 284. In other embodiments, the entire delay is applied by the delay element 276.

Accomplishing a fractional delay at the baseband stage in a digital microphone system is computationally intensive and has been eliminated by embodiments of the invention described herein by introducing the fractional delay in the oversampled signal domain. Equations (1), (2), and (3) from FIG. 2A apply to the digital microphone system of FIG. 2C. Here the digital microphone 272 is driven by a sampling clock frequency $F_{SF}$ the baseband sampling frequency is given by $f_{bb}$, therefore from equation (1) $f_{SF} > f_{bb}$. The ratio of the sampling clock frequency to the baseband sampling frequency is given by equation (2) as $R = f_{SF}/f_{bb}$. Equation (3) indicates that a fractional delay can be selected based on a number of sampling clock cycles N from the range 1≤N≤R, and the time delay which is applied by delay element 276 is given by equation (4) as: $\Delta t = N * \tau_{SF}$. Where $\tau_{SF}$ is the period of the sampling clock. In various embodiments, the PDM receiver module 280 is constructed with a sequence of stages as explained below in conjunction with the figures that follow.

Figure 3:
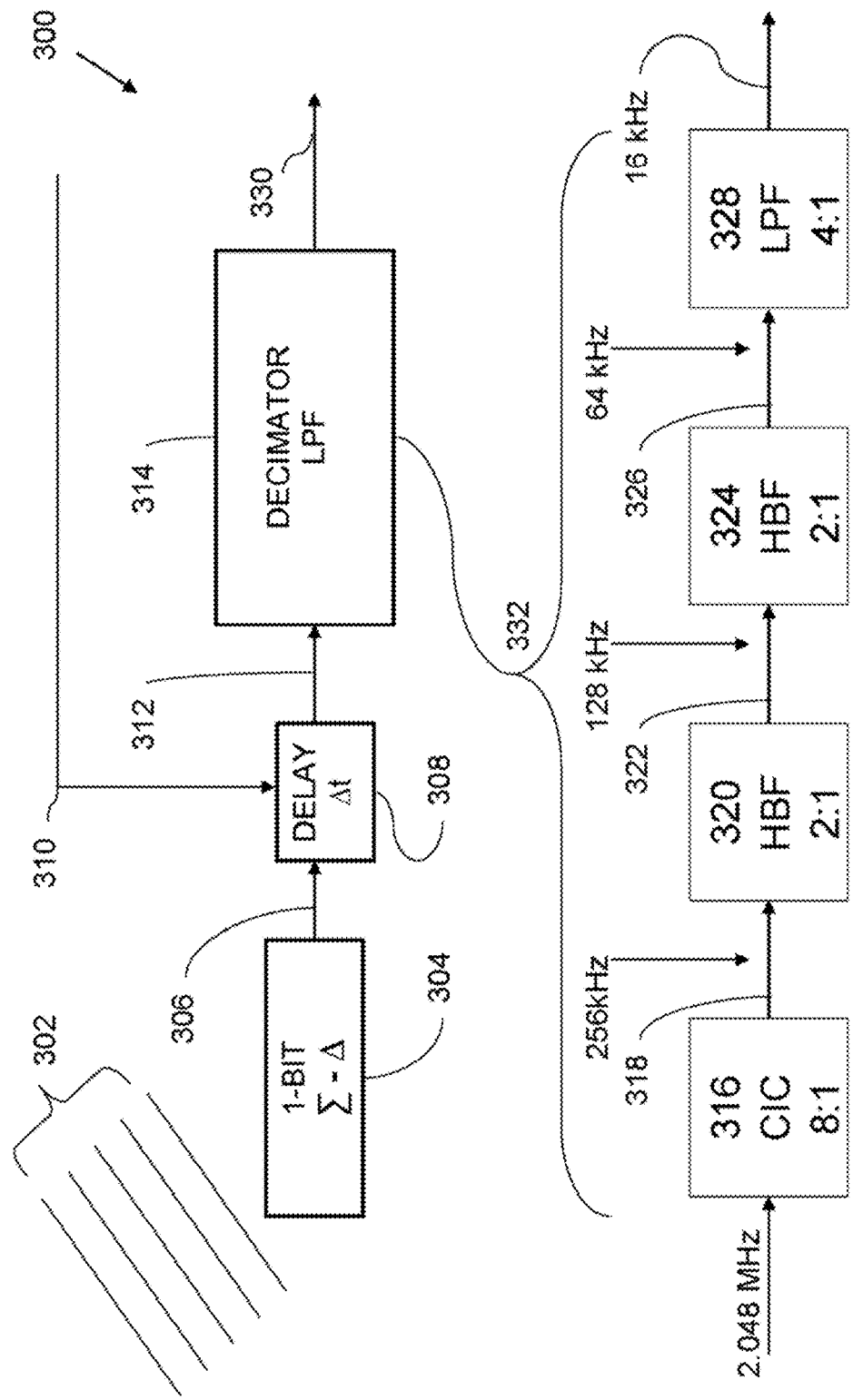
FIG. 3 illustrates applications of the system from FIG. 2C, according to embodiments of the invention.

FIG. 3 illustrates, generally at 300, applications of the system from FIG. 2C, according to embodiments of the invention. With reference to FIG. 3, a non-limiting example of a digital microphone system is provided with a four stage PDM receiver module. An analog field quantity e.g., an acoustic field 302 is sensed by a digital microphone 304. The digital microphone 304 employs a one-bit sigma-delta modulation to perform analog-to-digital conversion (ADC). In one non-limiting embodiment, the digital microphone 304 is driven with a 2.048 MHz sampling clock frequency to output an oversampled digital output signal at 306. In the example of FIG. 3, the baseband sampling frequency is chosen to be 16 kHz. From equation 2 (FIG. 2A), R=2,048,000/16,000=128. Thus, the period of the baseband sampling frequency can be divided by 128 by selecting a time delay $\Delta t$ which is related to a number of sampling clock cycles N from the range $1 \leq N \leq 128$. In this example, the time delay which is applied by delay element 308 is given by equation (4) from FIG. 2B as: $\Delta t = N*\tau_{SF}$ where $\tau_{SF}$ is the period of the 2.048 MHz sampling clock frequency, which equals $4.8828 \times 10^{-7}$ seconds. Equation (4) from FIG. 2B then provides as a fractional delay: $\Delta t = N*4.8828 \times 10^{-7}$.

In one or more embodiments, the time delay element 308 is implemented with a buffer one-bit deep and 128 bits wide. At 8 bits per byte the buffer needed for time delay element 308 in the present example is of size 16 bytes. 16 bytes is a very small buffer which makes the system and process needed to impart a fractional time delay to an oversampled digital signal much less resource intensive than that of existing systems which impart a fractional time delay to the baseband signal through application of filtering and or post processing in the baseband domain. The time delay element 308 can be configured to be controllable, such that the time delay imparted to the oversampled digital signal can be set using a control line 310. A controller can be configured with one or more digital microphones according to embodiments of the invention to provide a steerable array of microphones for beamforming applications. Utilizing a controller with multiple microphones is described more fully below in conjunction with the figures that follow.

Illustrated in FIG. 3, is a PDM receiver module 314 which has, in one embodiment, an architecture based on four main stages, also shown in FIG. 3 in enlarged view at 332. The time delay element 308 applies a delay to the oversampled digital signal outputting a time delayed oversampled digital signal at 312. The oversampled digital signal 312 is input in the PDM receiver module 314 and enters a first stage 316. For the purpose of this example, the first stage of the PDM receiver module 314 is a cascaded-integrator-comb (CIC) filter structure. The integrator keeps a running sum of values adding each new sample, the comb filter subtracts off the oldest sample. The CIC filter is a cascade of integrator comb stages. The final component is a decimator which reduces the sampling rate by a multiple of 2. In the example of FIG. 3, the CIC filter provides 8:1 decimation which reduces the sampling clock frequency of 2.048 MHz to 256 kHz at 318 following the CIC 316 stage. The CIC stage 316 low pass filters the input digital signal 312 thereby providing an increase to the dynamic range of the output digital signal at 318.

In the example of FIG. 3, the second stage of PDM receiver module 314 is a half-band filter 320. Half-band filter 320 decimates by a factor of 2:1 thereby reducing the sampling rate of the input signal 318 from 256 kHz to 128 kHz at the output 322. Half-band filter 320 provides further low pass filtering and a further increase in dynamic range of the signal at 322.

Similarly, in the example of FIG. 3, the third stage of PDM receiver module 314 is a half-band filter 324. Half-band filter 324 decimates by a factor of 2:1 thereby reducing the sampling rate of the input signal 322 from 128 kHz to 64 kHz at the output 326. Half-band filter 324 provides further low pass filtering and a further increase in dynamic range of the signal at 326

In the example of FIG. 3, the fourth stage of PDM receiver module 314 is a low pass filter 328 which decimates by a factor of 4:1 thereby reducing the input digital signal at 326 from a sample rate of 64 kHz to a baseband sample rate of 16 kHz at 330. A finite impulse response (FIR) filter structure or an infinite impulse response (IIR) filter structure can be used in the stages of the PDM receiver module 314 described above, such as, for example in low pass filter 328, etc. Thus, the PDM receiver module receives as an input a time delayed oversampled digital signal at 312 with sampling rate of 2.048 MHz and outputs a baseband signal, which in some embodiments is an acoustic signal, at a baseband sampling rate of 16 kHz at 330. Note that in order to eliminate aliasing, the useful frequency range of the baseband signal will be reduced by a factor of 1/2 from the baseband sampling rate in order to satisfy the Nyquist sampling criteria which requires the maximum useful frequency $F_{NYQUIST} \leq f_{bb}/2$, where $f_{bb}$ is the baseband sample rate.

Figure 4:
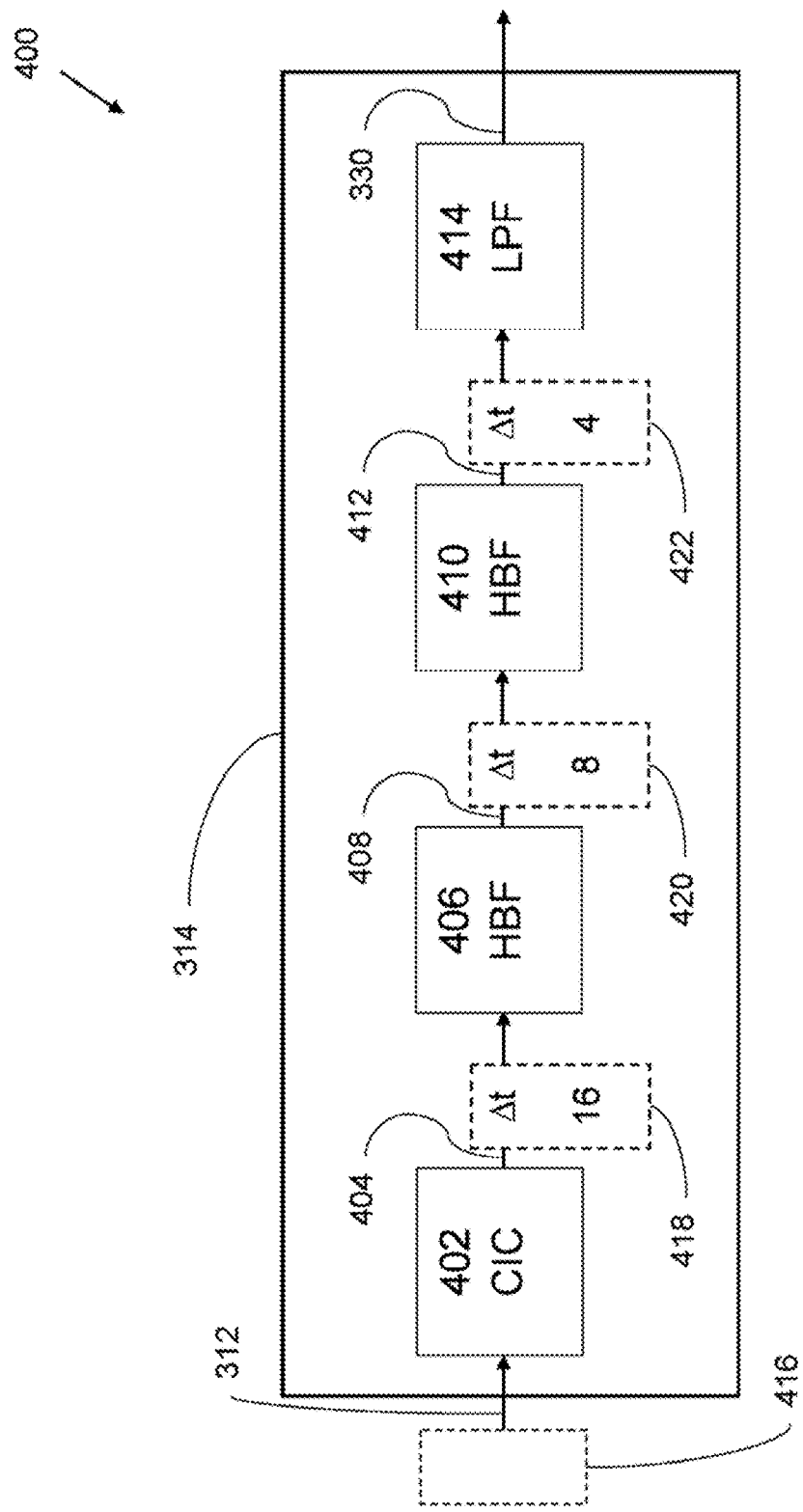
FIG. 4 illustrates a pulse density modulation (PDM) receiver architecture, according to embodiments of the invention.

FIG. 4 illustrates, generally at 400, a pulse density modulation (PDM) receiver architecture, according to embodiments of the invention. With respect to FIG. 4, alternative locations for the time delay element 308 from FIG. 3 are illustrated. An initial position for the time delay element 416 corresponds with the position of the time delay element 308 in FIG. 3. In this initial position, as described above the time delay element 416 delays the oversampled digital signal and outputs a time delayed digital signal at 312.

The time delay element can be located throughout the oversampled domain of the PDM module 314. In FIG. 4, a first alternative location of the delay element is indicated at 418 between the first stage 402 and the second stage 406 at location 418. In this alternative location, in one embodiment, the time delay element 416 is removed and 312 represents the digital oversampled signal, the time delay is applied internal to 314. When the delay element is located at 418 the number of fractional delay elements is obtained by dividing the sampling rate which exists at 404, which is the output of 402 and the input to time delay element at 418, by the baseband sampling rate at 330. For the non-limiting example of FIG. 3, R=256 kHz/16 kHz=16. Thus, the fractional delay which can be imparted by the time delay element when located at position 418 is calculated by equation (4) from FIG. 2B as: $\Delta t = N*T_{SF}$ where is the period of the 256 kHz sampling rate period equals $3.90625 \times 10^{-6}$ seconds. Equation (4) from FIG. 2B then provides: $\Delta t = N*3.90625 \times 10^{-6}$ seconds.

In FIG. 4, a second alternative location of the delay element is indicated at 420 between the second stage 406 and the third stage 410 at location 420. In this alternative location, in one embodiment, the time delay element 416 is removed and 312 represents the digital oversampled signal, the time delay is applied internal to 314. When the time delay element is located at 420 the number of fractional delay elements is obtained by dividing the sampling rate which exists at 408, which is the output of 406 and the input to time delay element at 420, by the baseband sampling rate at 330. For the non-limiting example of FIG. 3, R=128 kHz/16 kHz=8. Thus, the fractional delay which can be imparted by the time delay element when located at position 420 is calculated by equation (4) from FIG. 2B as: $\Delta t = N * TSF$ where TSF is the period of the 128 kHz sampling rate period which equals $7.8125 \times 10^{-6}$ seconds. Equation (4) from FIG. 28 then provides: $\Delta t = N * 7.8125 \times 10^{-6}$ seconds.

In FIG. 4, a third alternative location of the delay element is indicated at 422 between the third stage 410 and the fourth stage 414 at location 422. In this alternative location, in one embodiment, the time delay element 416 is removed and 312 represents the digital oversampled signal, the time delay is applied internal to 314. When the delay element is located at 422 the number of fractional delay elements is obtained by dividing the sampling rate which exists at 412, which is the output of 410 and the input to time delay element at 422, by the baseband sampling rate at 330. For the example of FIG. 3, R=64 kHz/16 kHz=4. Thus, the fractional delay which can be imparted by the time delay element when located at position 422 is calculated by equation (4) from FIG. 2B as: $\Delta t = N * T_{SF}$ where $T_{SF}$ is the period of the 64 kHz sampling rate period which equals $1.5625 \times 10^{-5}$ seconds. Equation (4) from FIG. 2B then provides: $\Delta t = N * 1.5625 \times 10^{-5}$ seconds. In other embodiments, a time delay element can be located in a plurality of locations, i.e., one or more of 416, 418, 420, and 422.

Figure 5:
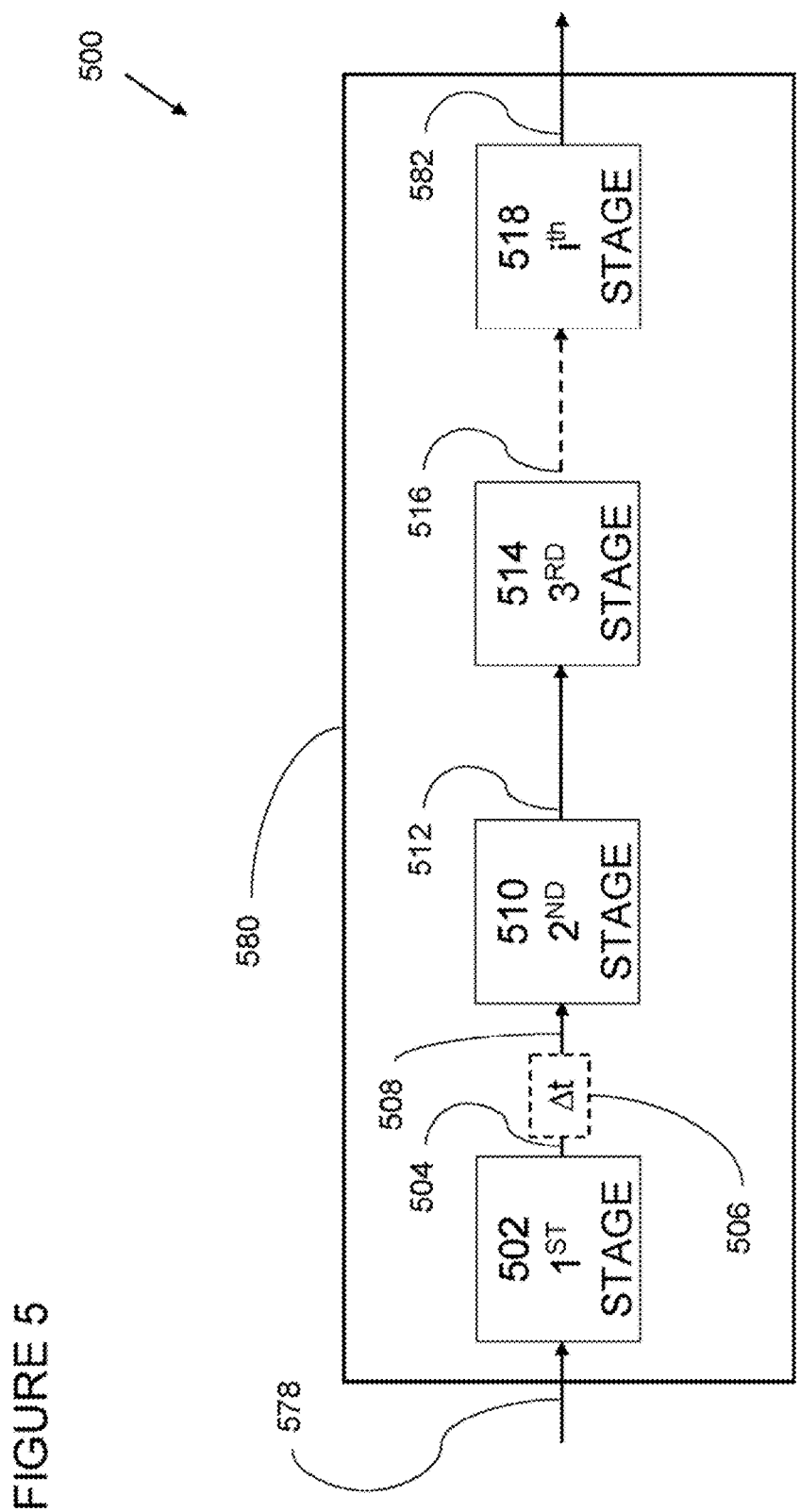
FIG. 5 illustrates placing a time delay between stages of a pulse density modulation (PDM) receiver, according to embodiments of the invention.

FIG. 5 illustrates, generally at 500, placing a time delay between stages of a pulse density modulation (PDM) receiver, according to embodiments of the invention. With respect to FIG. 5, a PDM receiver module 580 is illustrated with an oversampled digital input signal at 578. The oversampled digital input signal 578 originates in various embodiments, for example, from a digital microphone such as 272 in FIG. 2C. The PDM receiver module 280 is configured with a 1st stage 502, a second stage 510, a third stage 514, and up to an $i^{th}$ stage 518. Each stage can provide one or both of decimation and low pass filtering. A time delay element 506 is located between the first stage 502 the second stage 510. In operation, an oversampled digital signal 578 originates from example a digital microphone or another type of digital sensor as described above.

The oversampled digital signal 578 is input into a first stage 502 of the PDM receiver module 580 where the signal is decimated and low pass filtered. An output of the first stage 502 is then input at 504 into the time delay element 506. An output of the time delay element 506 is input at 508 into the second stage 510. The second stage 510 performs further decimation and low pass filtering with an output 512 providing an input into the third stage 514. The third stage 514 performs further decimation and low pass filtering with an output 516 providing an input into the $i^{th}$ stage 518. The $i^{th}$ stage 518 provides the output 582 from the PDM receiver module 580 which can be configured to be at the baseband sampling rate. In various other embodiments, the time delay element 506 can be placed between other stages of the PDM receiver module 580.

Figure 6:
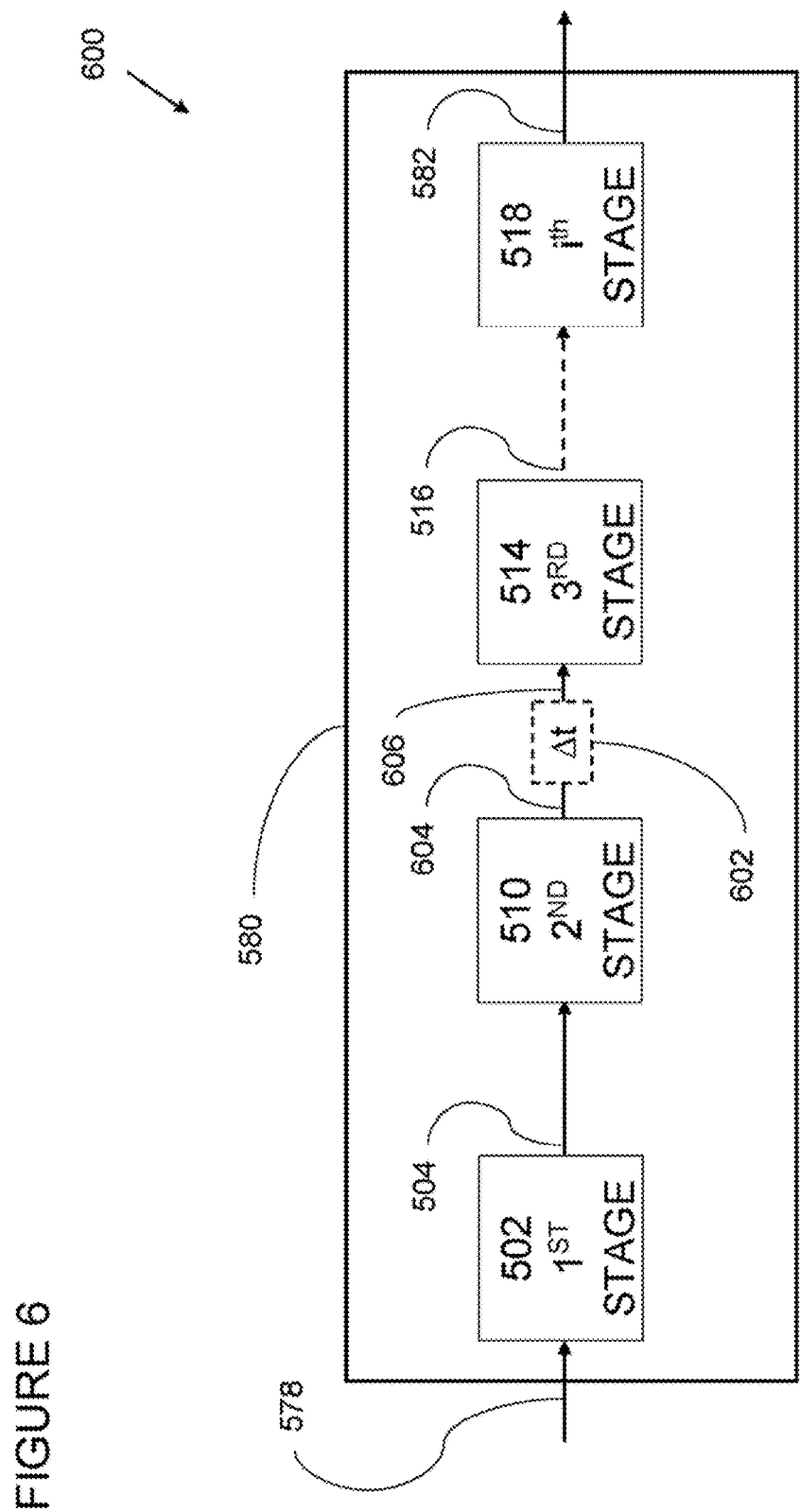
FIG. 6 illustrates placing a time delay between different stages of a pulse density modulation (PDM) receiver, according to embodiments of the invention.

FIG. 6 illustrates, generally at 600, placing a time delay in between different stages of a pulse density modulation (PDM) receiver, according to embodiments of the invention. With respect to FIG. 6, the PDM receiver module 580 from FIG. 5 illustrated with stages 502, 510, 514, up to 518. Here in FIG. 6, a time delay element is inserted between the second stage 510 and the third stage 514. An output 604 from the second stage 510 is input to a time delay element 602. An output 606 from the time delay element 602 is a time delayed digital signal at an intermediate sampling rate.

Figure 7:
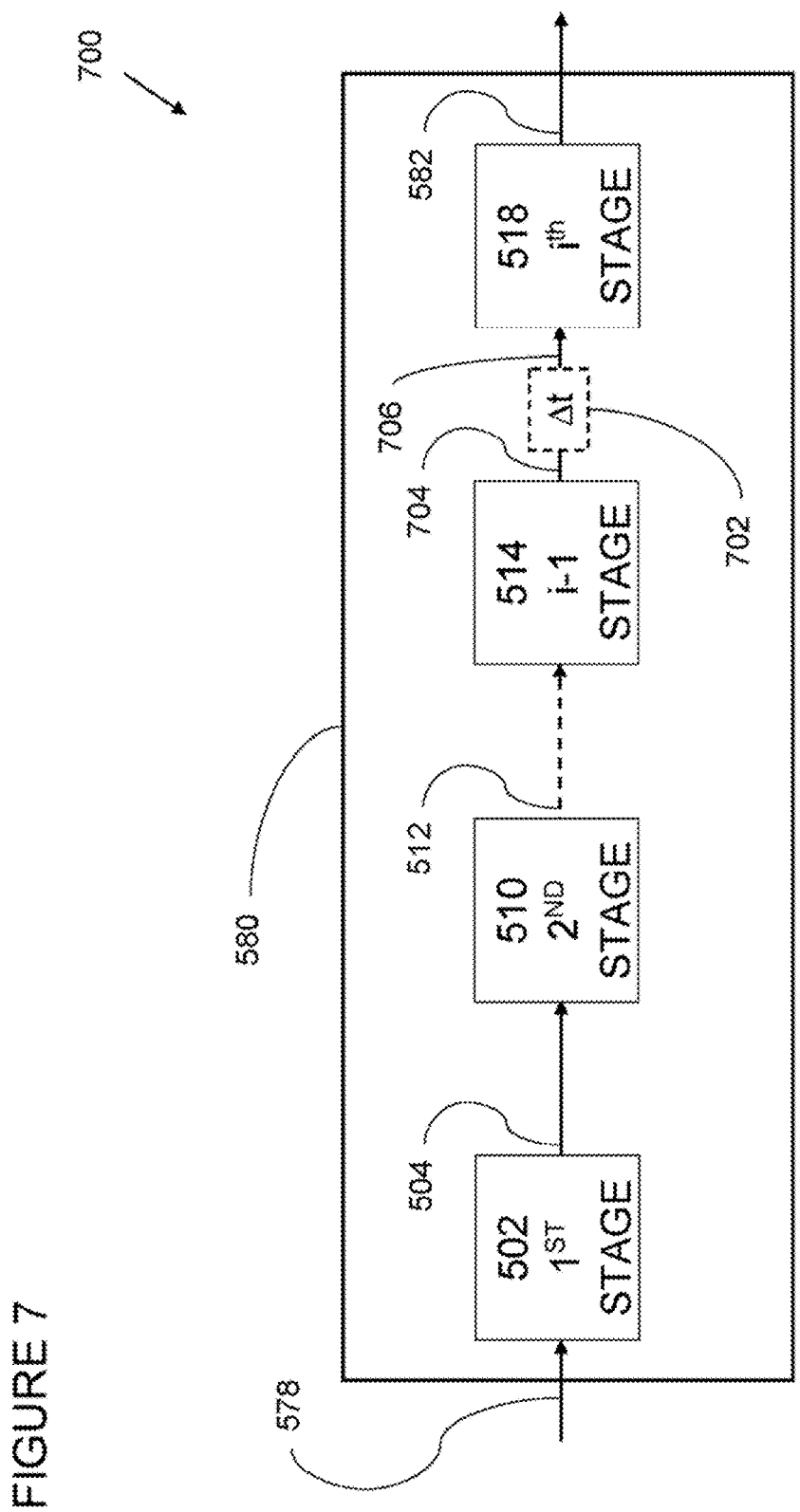
FIG. 7 illustrates placing a time delay in yet another location within a pulse density modulation (PDM) receiver, according to embodiments of the invention.

FIG. 7 illustrates, generally at 700, placing a time delay in yet another location within a pulse density modulation (PDM) receiver, according to embodiments of the invention. With respect to FIG. 7, the PDM receiver module 580 from FIG. 5 illustrated with stages 502, 510, 514, up to 518. In FIG. 7, a time delay element is inserted between the i-1 stage 514 and the $i^{th}$ stage 518. An output 704 from the i-1 stage 514 is time delayed at time delay element 702. An output 706 from the time delay element 702 is a time delayed digital signal at an intermediate sampling rate which is input into the $i^{th}$ stage 518 for further processing before being output at 582 from the PDM receiver module 580. The output 582 is at a sampling frequency which is a reduced sample rate, which in some embodiments can be the baseband sample rate of the desired output signal from the system.

Figure 8:
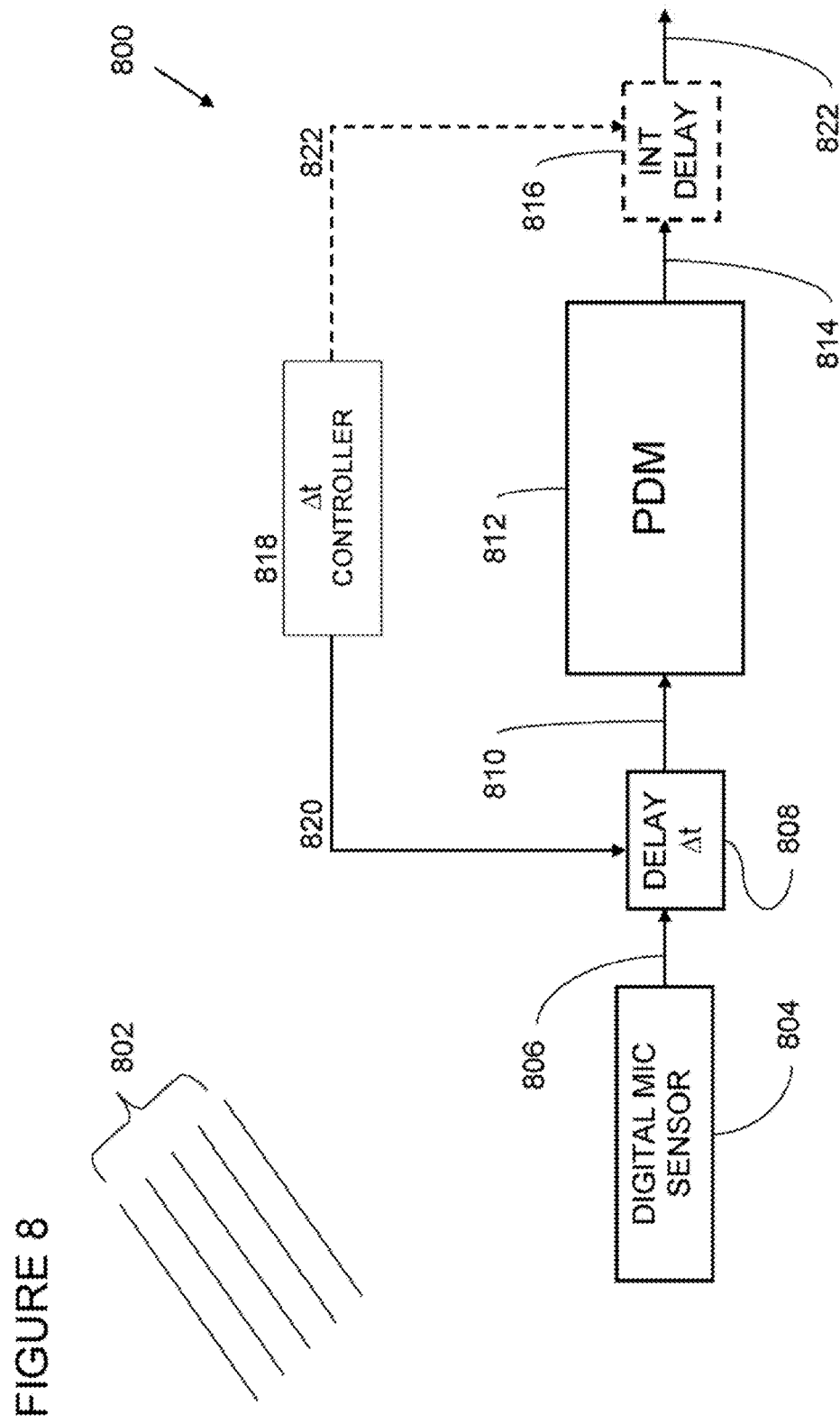
FIG. 8 illustrates programmable time delay in an analog-to-digital converter (ADC) system, according to embodiments of the invention.

FIG. 8 illustrates, generally at 800, programmable time delay in an analog-to-digital converter (ADC) system, according to embodiments of the invention. With respect to FIG. 8, an analog field quantity is represented by 802 incident on a digital sensor 804, which in various embodiments, is a digital microphone, vibration sensor, electromagnetic energy sensor, etc. For the discussion herein, digital sensor 804 is referred to as a digital microphone without limitation implied thereby. In response to the incident field 802 the digital microphone 804 outputs an oversampled digital signal at 806. The oversampled digital signal output 806 is input to a time delay element 808 which outputs a time delayed oversampled digital output at 810. The time delayed oversampled digital output 810 is input into a PDM receiver module 812. The PDM receiver module 812 can be a configured with a single stage or a multi-stage architecture as described above. At 814 an output from PDM receiver module 812 can optionally be time delayed at 816 before being output at 822. In some embodiments, a controller 818 provides a control signal 820 to the time delay element 808. In sonic embodiments, when the time delay element 816 is configured with the system, the controller 818 or a separate controller provides a control signal at 822 to the time delay element 816.

In various embodiments, the time delay element such as 808 can be configured as a buffer or to include a buffer which has a number of values, where each value corresponds to a different number of clock cycles of the sampling clock used within the digital sensor 804. In various embodiments, the time delay element 808 can be configured to provide a fixed time delay to the input digital signal 806 or the time delay element 808 can be programmable. In operation, the controller 818 provides a control signal 820 which is used to specify a number of sampling clock cycles which will be used by the time delay element 808 to provide the time delay to the input signal 806.

Similarly, when present in the system, the time delay element such as 816 can be configured as a buffer or to include a buffer which has a number of values, where each value corresponds to a different number of cycles at the lower sample rate corresponding to the output of the PDM receiver module 812. In various embodiments, the time delay element 816 can be configured to provide a fixed time delay to the input digital signal 814 or the time delay element 816 can be programmable. In operation, the controller 818 provides a control signal 822 which is used to specify a number of cycles at the lower sample rate which will be used by the time delay element 816 to provide the time delay to the input signal 814. Thus, the total time delay imparted by the system at the output 822 relative to the input 806 is the sum of the time delay imparted by the time delay element 808 and the time delay element 816.

Figure 9A:
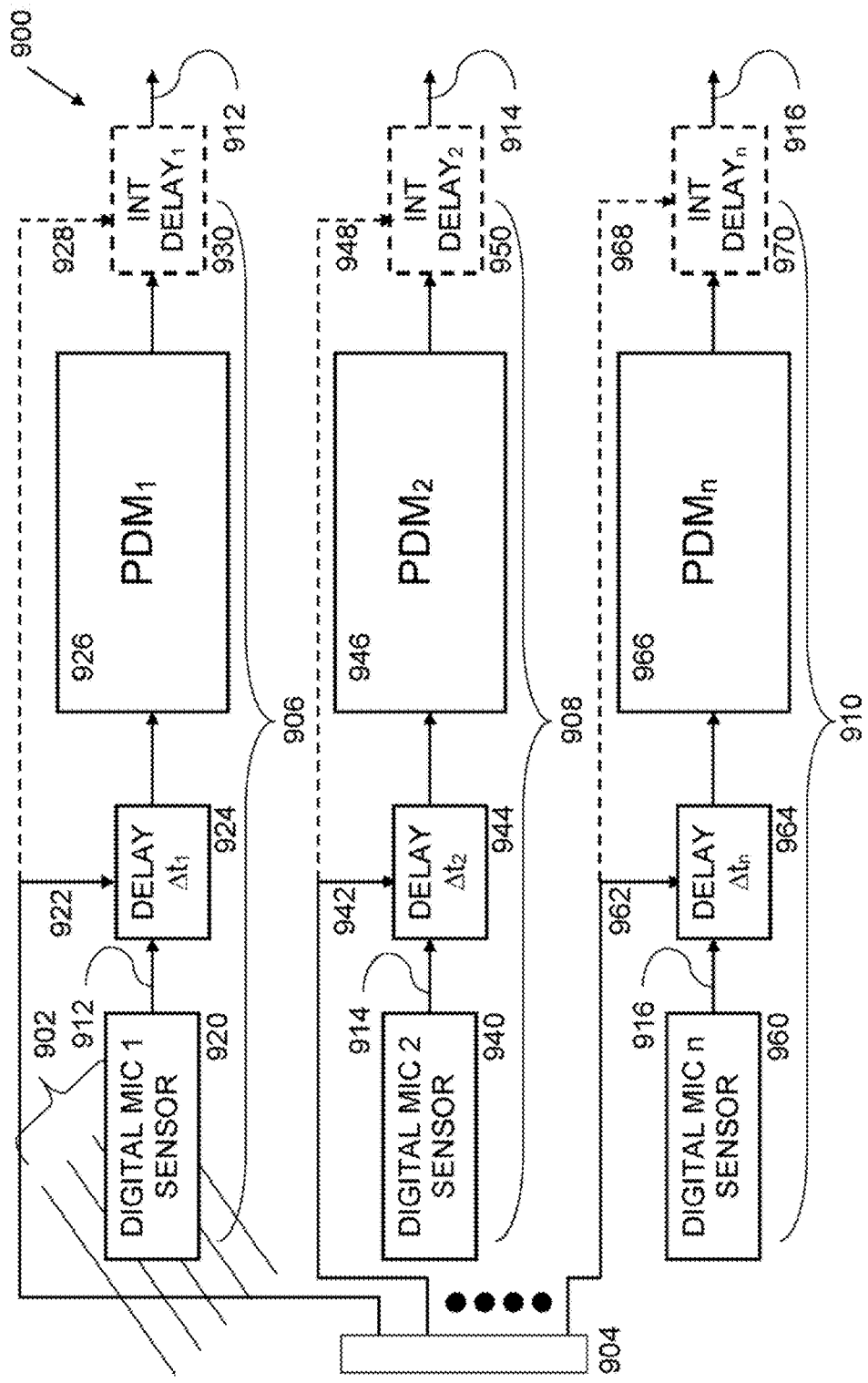
FIG. 9A illustrates time delays for multiple sensors, according to embodiments of the invention.

FIG. 9A illustrates, generally at 900, time delays for multiple sensors, according to embodiments of the invention. With respect to FIG. 9A, an analog field quantity is represented by 902, which is incident on digital sensors 920, 940, up to a general number of n sensors indicated by 960, which in various embodiments is a digital microphone, vibration sensor, electromagnetic energy sensor, etc. For the discussion herein, digital sensors 920, 940, and 960 are referred to as digital microphones without limitation implied thereby. Each digital microphone has a signal transmission path indicated by 906, 908 and 910. A controller 904 is used to adjust time delay(s), which are used to delay each of the microphone signal paths.

In operation, a time delay $\Delta t_1$ is associated with the digital signal output at 912 for the digital microphone 920. Similarly, a time delay $\Delta t_2$ is associated with the digital signal output at 914 for the digital microphone 930. And a time delay $\Delta t_n$ is associated with the digital signal output at 916 for the digital microphone 960. A controller 904 is used to supply one or more control signals to each signal path 906, 908, up to 910. As described above in the preceding figures, a control signal 922 supplied to a time delay element 924 is used to specify a time delay applied by the time delay element 924 to the oversampled digital signal received from the microphone 920. Optionally, the controller 904 can supply a control signal 928 to a time delay element 940 (if present in a given system configuration). Similarly, a control signal 942 supplied to a time delay element 944 is used to specify a time delay applied by the time delay element 944 to the oversampled digital signal received from the microphone 940. Optionally, the controller 904 can supply a control signal 948 to a time delay element 950 (if present in a given system configuration). Control signals are supplied as need to successive microphone signal paths, and finally within microphone signal path 910 a control signal 962 supplied to a time delay element 964 which is used to specify a time delay applied by the time delay element 964 to the oversampled digital signal received from the microphone 960. Optionally, the controller 904 can supply a control signal 968 to a time delay element 970 (if present in a given system configuration).

Note that the time delay element 924 can be located within the PDM receiver module 926, e.g., between stages of the PDM receiver module 926 as described in the figures above. Similarly, and without limitations, the time delay element 944 can be located within the PDM receiver module 946, e.g., between stages of the PDM receiver module 946 and the time delay element 964 can be located within the PDM receiver module 966, e.g., between stages of the PDM receiver module 966 as described in the figures above. The microphone signal paths 906, 908, up through 910 need not be configured in the same way. For example, one or more microphone signal paths can be configured with a time delay element inserted between a digital microphone and a PDM receiver module while another microphone signal path can be configured with a time delay element inserted internally to the PDM receiver module.

In various embodiments, the controller 904 is used to steer the array of microphones 920, 940, through 960 as needed in order to perform beamforming with the time delayed microphone signals 912, 914, through 916. As described in FIG. 9A, a general number of n microphones has been described; however, beamforming can be performed with as few as two microphones as described below in conjunction with FIG. 10.

Figure 9B:
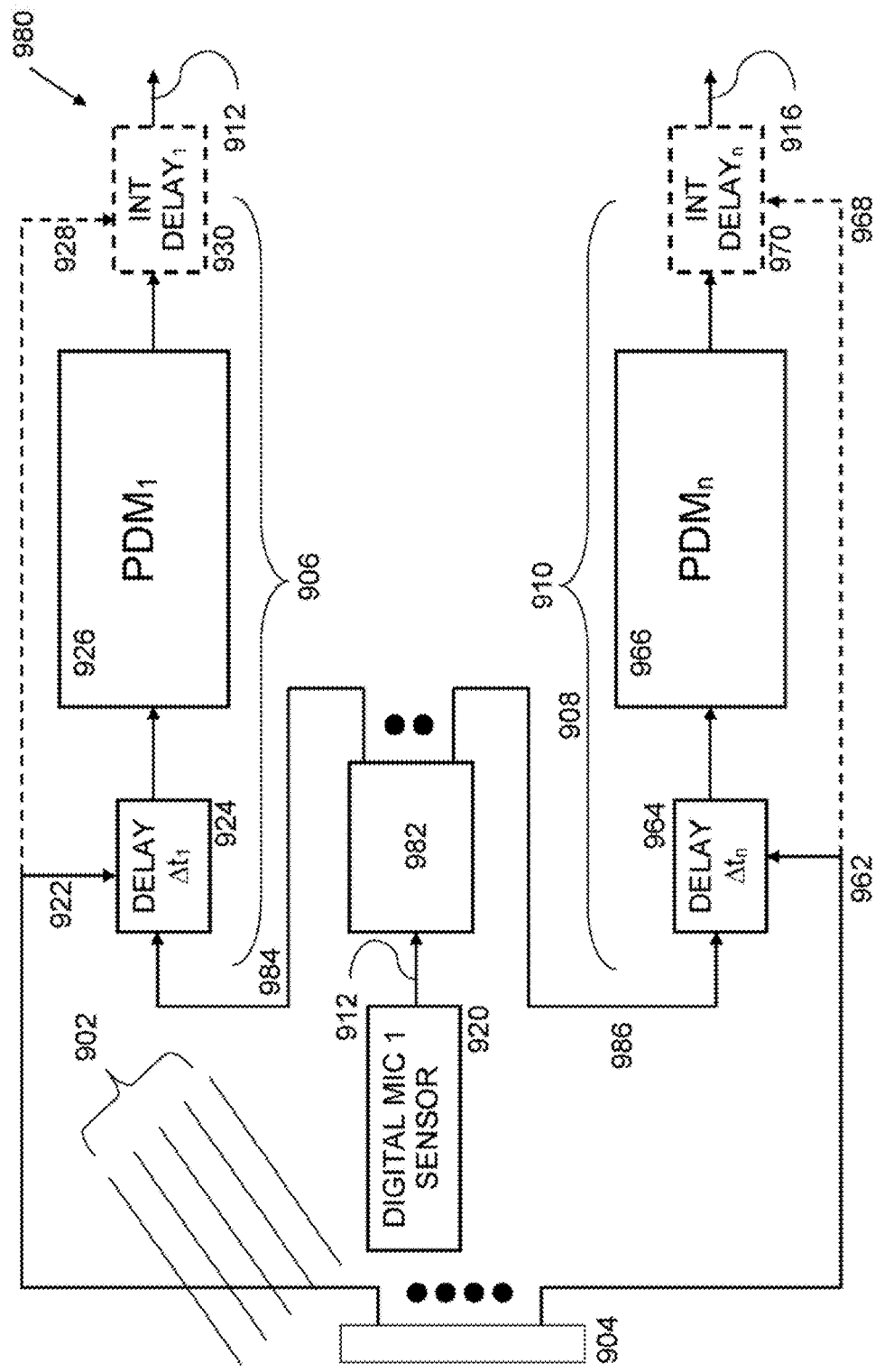
FIG. 9B illustrates multiple time delays applied to an output from a single sensor, according to embodiments of the invention.

FIG. 9B illustrates, generally at 980, multiple time delays applied to an output from a single sensor, according to embodiments of the invention. With respect to FIG. 9B, an analog field quantity is represented by 902, which is incident on a digital sensor 920, which in various embodiments is a digital microphone, vibration sensor, electromagnetic energy sensor, etc. For the discussion herein, the digital sensor 920 is referred to as digital microphone without limitation implied thereby. The digital microphone 920 outputs a signal 912 which is replicated (split) at 982 into n replicas, indicated by 984 through 986. Each replica of the microphone 920 signal 912 has a signal transmission path indicated by 906 through 910. A controller 904 is used to adjust time delay(s), which are used to delay each of the replicas 984 through 986 of the microphone signal paths.

In operation, the signal 912 is input into 982 in order to produce the n replicas 984 through 986. In various embodiments, 982 is an n-way splitter. In other embodiments, replication at 982 is accomplished by other means. In some embodiments, replication is performed in software. A time delay $\Delta t_1$ is associated with the digital signal output at 984 for the digital microphone 920 at 924. Similarly, a time delay $\Delta t_n$ is associated with the digital signal output at 986 for the digital microphone 920 at 964. A controller 904 is used to supply one or more control signals to each signal path 906 up to 910. As described above in the preceding figures, a control signal 922 supplied to the time delay element 924 is used to specify a time delay applied by the time delay element 924 to the oversampled digital signal received from the microphone 920, Optionally, the controller 904 can supply a control signal 928 to a time delay element 930 (if present in a given system configuration). Control signals are supplied as need to successive microphone signal paths, and finally within microphone signal path 910 a control signal 962 supplied to the time delay element 964 which is used to specify a time delay applied by the time delay element 964 to the oversampled digital signal received from the microphone 920 at 986. Optionally, the controller 904 can supply a control signal 968 to a time delay element 970 (if present in a given system configuration).

Note that the time delay element 924 can be located within the PDM receiver module 926, e.g., between stages of the PDM receiver module 926 as described in the figures above. Similarly, and without limitations, the time delay element 964 can be located within the PDM receiver module 966, e.g., between stages of the PDM receiver module 966 as described in the figures above. The microphone signal paths 906 up through 910 need not be configured in the same way. For example, one or more microphone signal paths can be configured with a time delay element inserted between a digital microphone and a PDM receiver module while another microphone signal path can be configured with a time delay element inserted internally to the PDM receiver module.

In various embodiments, the controller 904 is used to steer the array of signals obtained from the single microphone 920 as needed in order to perform beamforming with the time delayed microphone signals 912 through 916. As described in FIG. 9B, a general number of n time delayed signals from a single microphone has been described. However, beamforming, as described below in conjunction with FIG. 10, can be performed with as few as two time delayed signals (n=2) from a single microphone. Thus, in some embodiments, the n-way splitter is a splitter providing two outputs (n=2) from a single input.

Figure 10:
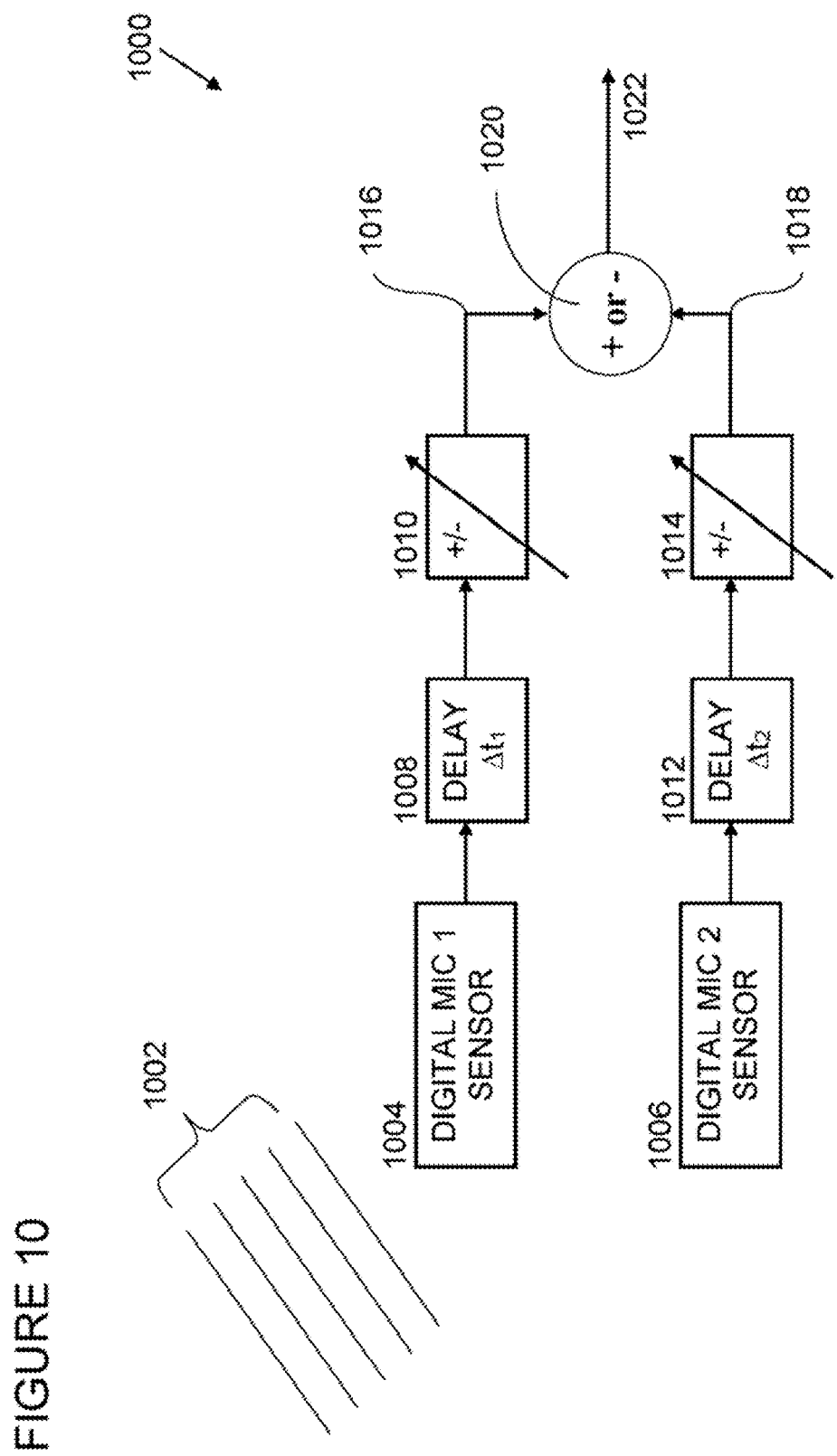
FIG. 10 illustrates beamforming, according to embodiments of the invention.

FIG. 10 illustrates, generally at 1000, beamforming, according to embodiments of the invention. With respect to FIG. 10, an analog field quantity is represented by 1002, which is incident on digital sensors 1004 and 1006. In one or more embodiments, the digital sensors 1004 and 1006 are digital microphones; however no limitation is implied thereby. The digital microphone 1004 outputs an over-sampled digital signal which is time delayed at a time delay element 1008. Optionally a gain is adjusted at 1010 which either increases or decreases an amplitude of the signal output at 1016. The second microphone 1006 outputs an oversampled digital signal which is time delayed at a time delay element 1012. Optionally a gain is adjusted at 1014 which either increases or decreases an amplitude of the signal output at 1018.

The signals 1016 and 1018 are input into an arithmetic block at 1020 and the beamformed output is provided at 1022. Depending on a given implementation of a system and the processing of the signals therein, the arithmetic block 1020 can perform a summation or a subtraction of the inputs 1016 and 1018 as needed for the given beamforming operation. In FIG. 10, beamforming is illustrated with two microphones however beamforming can be performed with a general number of microphones. The example of FIG. 10 is provided merely for illustration and does not limit embodiments of the invention.

Figure 11B:
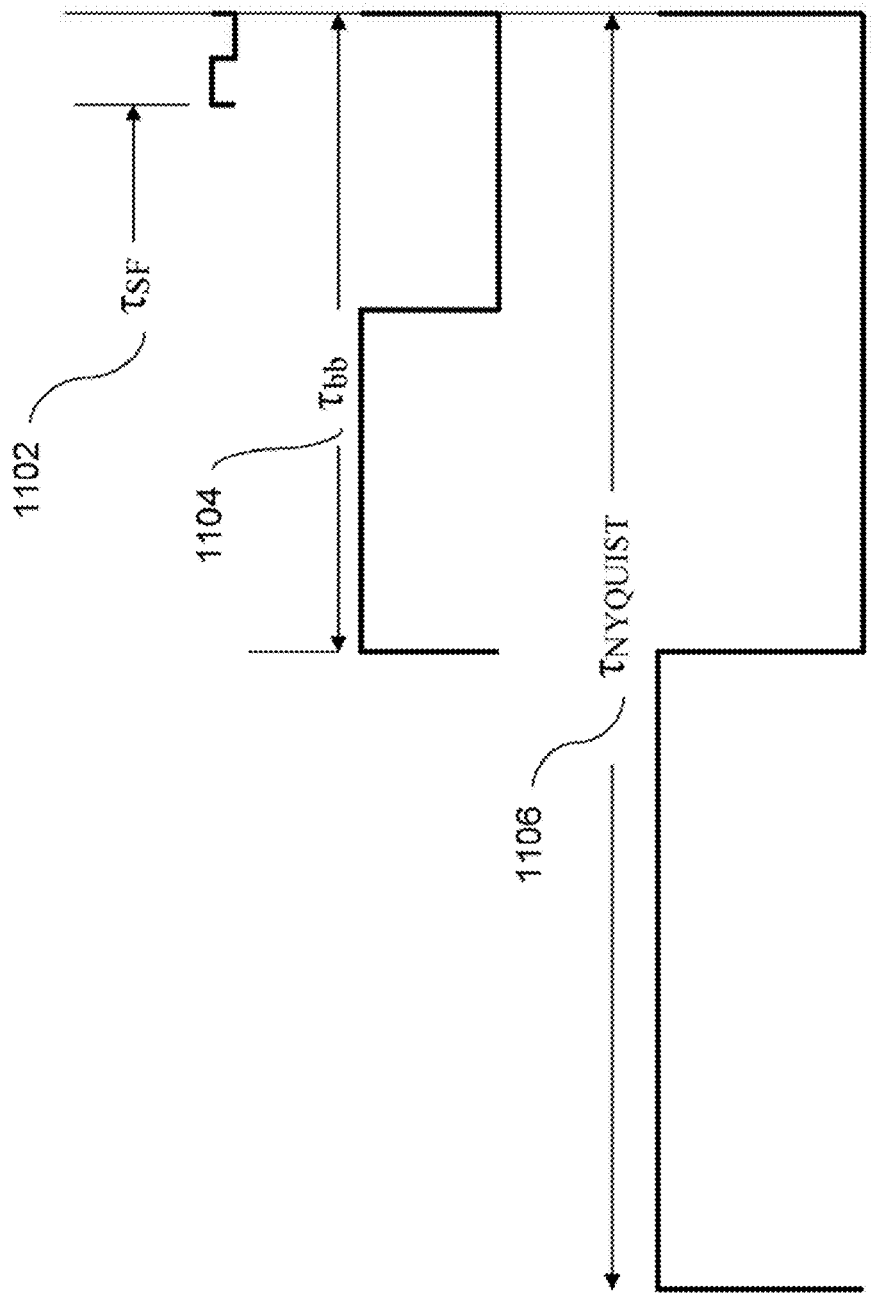

FIG. 11A and 11B illustrate increased resolution provided by a fractional delay, according to embodiments of the invention. Referring to FIG. 11A and FIG. 11B together, as described above, a "fractional delay" is used in this description of embodiments to refer to a fraction of a baseband sampling rate cycle. In the context of beamforming, increased resolution in time corresponds to increased resolution in space, which is advantageous to the beamforming process.

Equation (7) provides the relationship between a signal with frequency f and period τ. As described above, a time delay can be introduced into an output of an analog-to-digital converter (ADC) process which has an integer time delay based on the baseband sampling rate of the system given by equation (8). Similarly, when the time delay is introduced at the sampling clock frequency in the over-sampled domain, the time delay is given by equation (9)

Equations (8) and (9) are substituted into equation (2) FIG. 2A to yield equation (10). Solving equation (10) for $\Delta t_{fractional\ delay}$ yield for equation (11): $\Delta t_{fractional\ delay} = \Delta t_{integer\ delay}/R$.

The Nyquist sampling theorem states that the highest unaliased frequency "$f_{NYQUIST}$" which can be measured with sampling frequency $f_s$ is defined to be: $f_{NYQUIST}=f_s/2$, in this context the sampling frequency $f_s$ which is relevant is the baseband sampling rate $f_{bb}$. Thus $f_{NYQUIST}=f_{bb}/2$.

The periods for three waveforms are illustrated in FIG. 11B. 1102 is an illustration of a period corresponding with a sampling clock frequency which would be used to over-sample a digital sensor according to embodiments of the invention. 1104 is an illustration of a period of a baseband sampling rate which corresponds to the sampling rate after decimation of the oversampled signal. The relationship between periods 1102 and 1104 is given by equation (10). 1104 also represents an integer time delay which can be applied to a baseband signal. 1106 represents a period of the waveform that corresponds with the Nyquist frequency for the system. The Nyquist wavelength 1106 is the shortest wavelength (and highest frequency) of the field quantity that can be processed without aliasing.

Fractional time delay qualitatively represented by 1102 can be applied to baseband signal 1106 and represents an improvement in spatial resolution over the spatial resolution which could be achieved from integer time delay represented by 1104.

Field quantities such as those indicated in the figures above represent wave propagation in a medium. In the case of acoustic wave propagation, the relevant medium is either air or water and the speed of sound in air is nominally 340 meters per second. The speed of sound will vary as the physical properties of a medium change, for example in the case of air and water the speed of sound will vary with temperature, pressure, and salinity (water). In the on-limiting examples presented herein a nominal value of 340 meters per second is used for illustration purposes and no limitation is implied thereby.

Fractional time delay permits the spatial resolution of a system used for beamforming to be increased with respect to the spatial resolution achievable with integer time delay. The spatial resolution is given by Δx in terms of C and $\Delta t_{fractional\ delay}$, where $\Delta x = C * \Delta t_{fractional\ delay}$.

In other embodiments as described above a time delay element can be inserted within a receiver module for a digital oversampled sensor such as for example a PDM receiver module. In such cases a period 1102 represents an intermediate sampling rate. The number of sampling clock cycles or intermediate sampling rate cycles that are used to produce a time delay in the oversampled domain that is incorporated into the decimated and low pass filtered signal can vary as described above.

In the oversampled systems described above, in various non-limiting embodiments, the variable R has been used to represent the ratio of the sampling clock frequency (at the digital microphone) to the sampling rate at baseband. In the non-limiting example of FIG. 3, with $f_{SF}$ equal to 2.048 MHz and $f_{bb}$ equal to 16 kHz, then from equation 2 in FIG. 2A, $R=F_{SF}/f_{bb}=128$. From equation (10) in FIG. 11A in this non-limiting example a minimum fraction that R represents with respect to the integer sampling rate is 1/128. Other fractional time delay values are achieved by the techniques described herein, such as delaying for additional clock cycles at $f_{SF}$ or additional intermediate sampling rate cycles or by changing the sampling clock frequency that is used to drive the ADC in the digital sensor.

Figure 12:
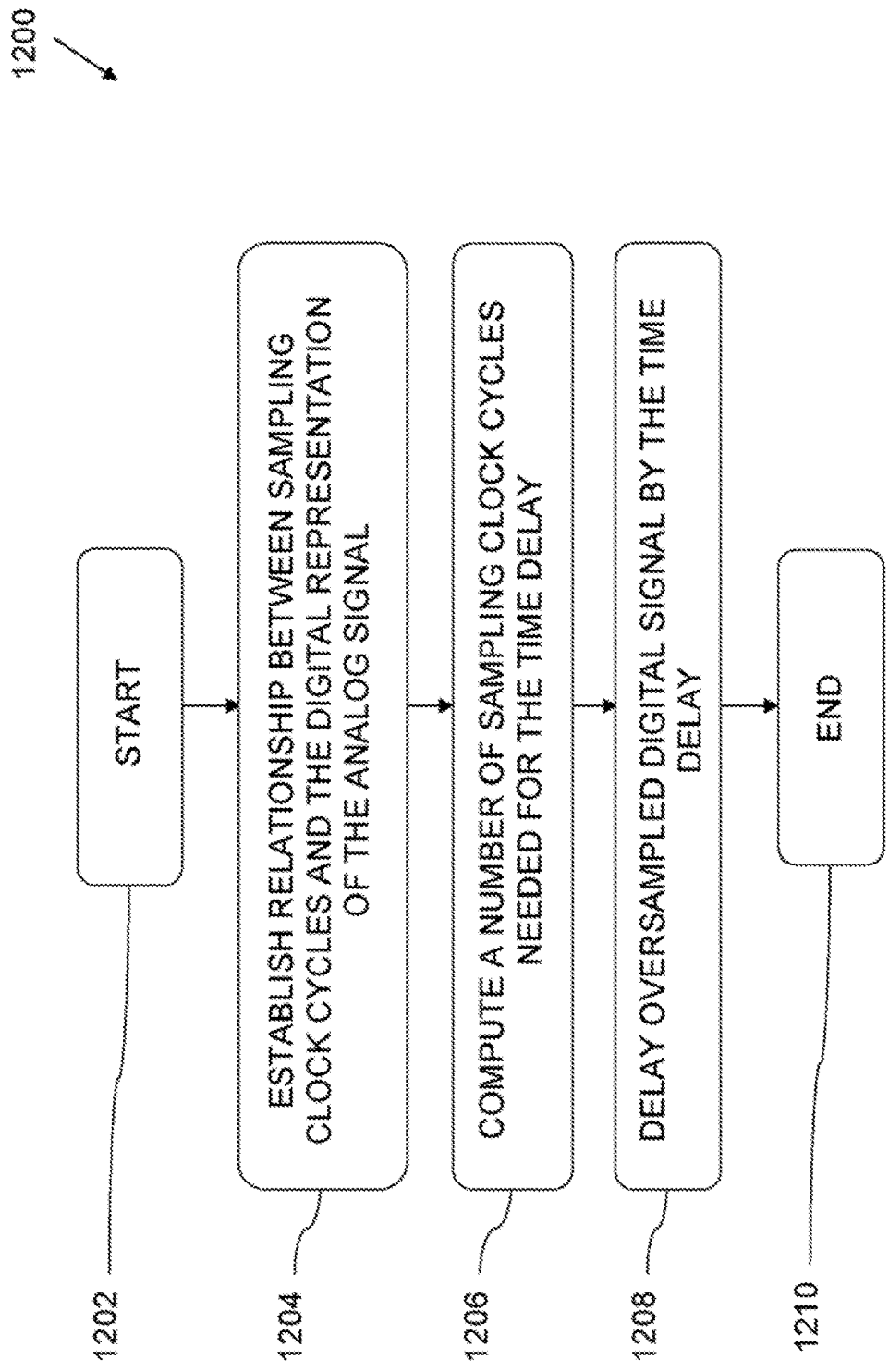
FIG. 12 illustrates a process to impart a time delay to an oversampled system, according to embodiments of the invention.

FIG. 12 illustrates, generally at 1200, a process to impart a time delay to an oversampled system, according to embodiments of the invention. With reference to FIG. 12, a process begins at a block 1202. At a block 1204 a relationship is established between sampling clock cycles and the digital representation of the analog signal produced by the digitization methodology employed in an analog-to-digital converter (ADC) process. In some instances, this is a one-bit deep process such as with Pulse Density Modulation (PDM) described above. In other embodiments, the process is other than one-bit deep but is then multiple bits deep. At a block 1206 a number of clock cycles needed for a given time delay is computed taking into consideration the bit depth of the encoding methodology used in the ADC. At a block 1208 the oversampled digital signal is delayed by a number of clock cycles that represents the time delay calculated in the block 1206. The process stops at the block 1210.

Figure 13:
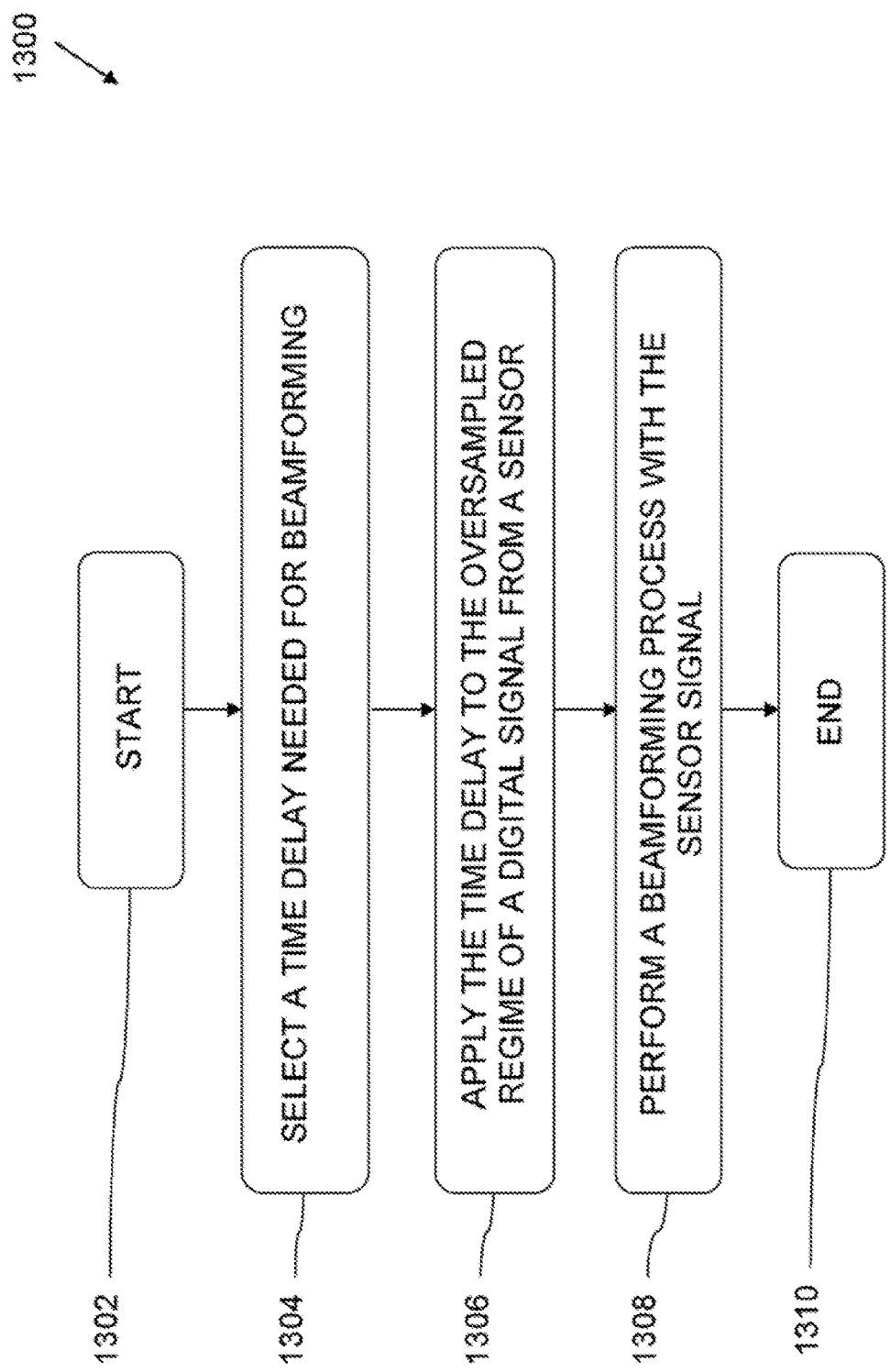
FIG. 13 illustrates a process to use a time delay imparted to an oversampled system in a beamforming process, according to embodiments of the invention.

FIG. 13 illustrates, generally at 1300, a process to use a time delay imparted to an oversampled system in a beamforming process, according to embodiments of the invention. With reference to FIG. 13, a process starts with a block 1302. At a block 1304 a time delay is selected for a beamforming process. At a block 1306 the time delay from the block 1304 is applied to a digitally oversampled signal in the oversampled domain for the signal. The oversampled domain for the signal can be, as described in the figures above, between the digital sensor and a receiver module for the digital sensor or in other embodiments the time delay is inserted at a location within the receiver module. In yet other embodiments, the time delay is inserted at more than one location within the oversampled domain. At a block 1308 a beamforming process is performed with the time delayed digital signal that represents the field quantity of interest. The time delay applied in the beamforming process at the block 1308 can be a fractional time delay with respect to a baseband sampling rate or it can be a sum of the fractional time delay and an integer time delay. In some embodiments, a magnitude of the time delay applied in the oversampled domain can exceed the duration of a sampling interval (or clock cycle) in the baseband domain. Thus, use of the terms "fractional delay" does not limit embodiments of the invention, but is used herein to describe the relative magnitude of the delays in some embodiments. Where the integer time delay is a number of baseband sampling rate cycles. The process ends at a block 1310.

Figure 14:
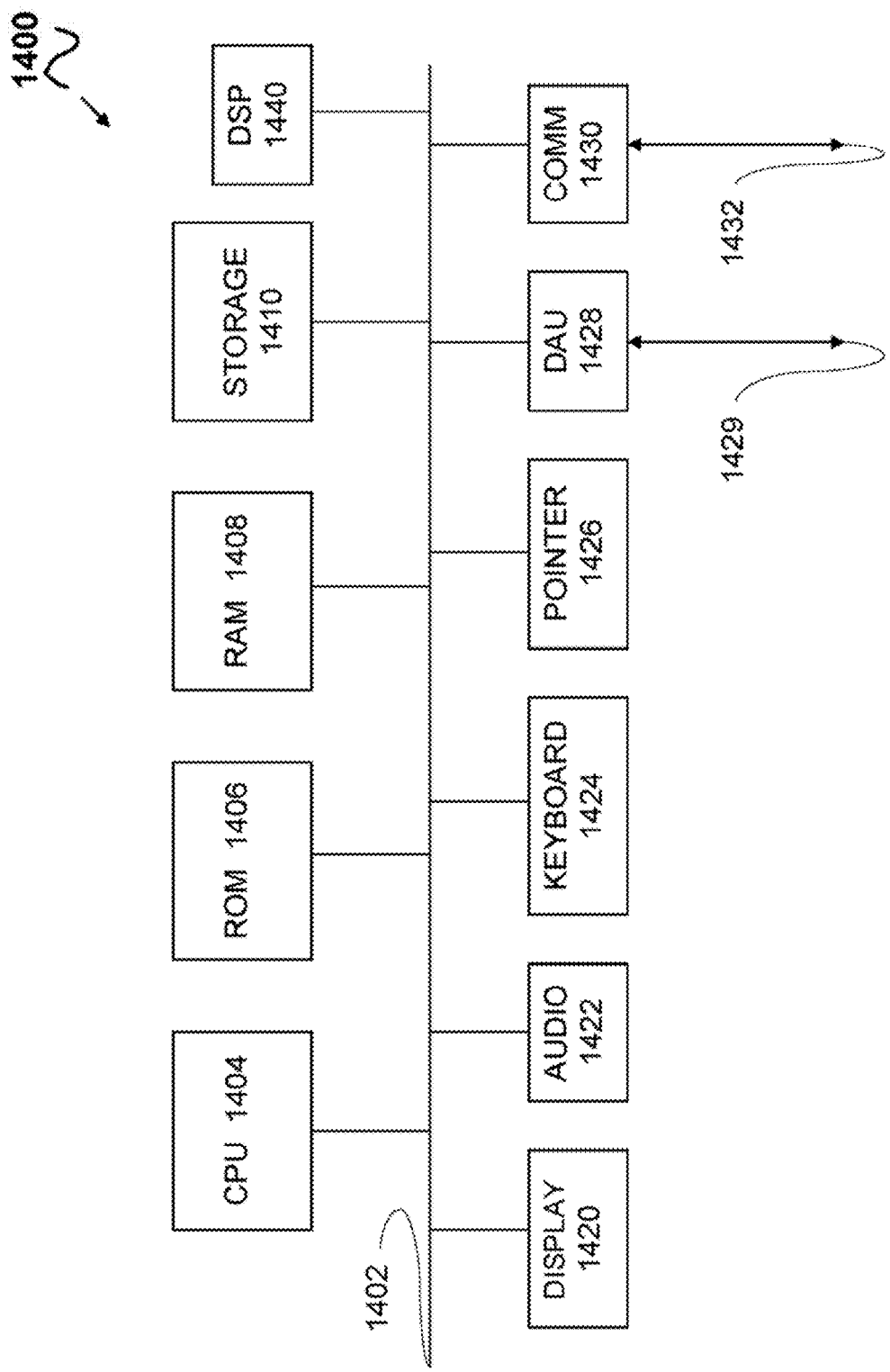
FIG. 14 illustrates a data processing system in which embodiments of the invention may be used.

FIG. 14 illustrates, generally at 1400, a data processing system in which embodiments of the invention may be used. The block diagram is a high-level conceptual representation and may be implemented in a variety of ways and by various architectures. With reference to FIG. 14, bus system 1402 interconnects a Central Processing Unit (CPU) 1404, Read Only Memory (ROM) 1406, Random Access Memory (RAM) 1408, storage 1410, display 1420, audio 1422, keyboard 1424, pointer 1426, data acquisition unit (DAU) 1428, and communications 1430. The bus system 1402 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), or a dedicated bus designed for a custom application, etc. The CPU 1404 may be a single, multiple, or even a distributed computing resource or a digital signal processing (DSP) chip. Storage 1410 may be Compact Disc (CD), Digital Versatile Disk (DVD), hard disks (HD), optical disks, tape, flash, memory sticks, video recorders, etc. The signal processing system 1400 can be an acoustic signal processing system used to receive acoustic signals that are input from a single microphone or a plurality of microphones (e.g., a first microphone, a second microphone, etc.). Note that depending upon the actual implementation of the acoustic signal processing system, the acoustic signal processing system may include some, all, more, or a rearrangement of components in the block diagram. In some embodiments, aspects of the system 1400 are performed in software. While in some embodiments, aspects of the system 1400 are performed in dedicated hardware such as a digital signal processing (DSP) chip 1440, or a system on a chip (SOC) which can also be represented at 1440, etc. as well as combinations of dedicated hardware and software as is known and appreciated by those of ordinary skill in the art.

Thus, in various embodiments, acoustic signal data is received at 1429 for processing by the acoustic signal processing system 1400. Such data can be transmitted at 1432 via communications interface 1430 for further processing in a remote location. Connection with a network, such as an intranet or the Internet is obtained via 1432, as is recognized by those of skill in the art, which enables the acoustic signal processing system 1400 to communicate with other data processing devices or systems in remote locations.

For example, embodiments of the invention can be implemented on a computer system 1400 configured as a desktop computer or work station, on for example a WINDOWS® compatible computer running operating systems such as WINDOWS® XP Home or WINDOWS® XP Professional, WINDOWS® 10 Home or WINDOWS® 10 Professional, Linux, Unix, etc. as well as computers from APPLE COMPUTER, Inc. running operating systems such as OS X, etc. Alternatively, or in conjunction with such an implementation, embodiments of the invention can be configured with devices such as speakers, earphones, video monitors, etc. configured for use with a Bluetooth communication channel. In yet other implementations, embodiments of the invention are configured to be implemented by mobile devices such as a smart phone, a tablet computer, a wearable device, such as eye glasses, a near-to-eye (NTE) headset, or the like.

In various embodiments, the components of systems as well as the systems described in the previous figures are implemented in an integrated circuit device, which may include an integrated circuit package containing the integrated circuit. In some embodiments, the components of systems as well as the systems are implemented in a single integrated circuit die. In other embodiments, the components of systems as well as the systems are implemented in more than one integrated circuit die of an integrated circuit device which may include a multi-chip package containing the integrated circuit.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, waveforms, data, time series or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk read-only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, network PC's, minicomputers, mainframe computers, and the like. The invention can also be practiced in distributed computing environments where tasks are performed by remote processing devices that are linked through a communications network. In other examples, embodiments of the invention as described in the figures above can be implemented using a system on a chip (SOC), a Bluetooth chip, a digital signal processing (DSP) chip, a codec with integrated circuits (ICs) or in other implementations of hardware and software.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, mathematical expression, flow diagram or flow chart. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Non-transitory machine-readable media is understood to include any mechanism for storing information in a form readable by a machine (e.g., a computer). For example, a machine-readable medium, synonymously referred to as a computer-readable medium, includes read only memory (ROM); random access memory (RAM); magnetic disk storage media; optical storage media; flash memory devices; except electrical, optical, acoustical or other forms of transmitting information via propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Thus, embodiments of the invention can be used in various acoustic systems. Some non-limiting examples of such systems are, but are not limited to, use in short boom headsets, such as an audio headset for telephony suitable for enterprise call centers, industrial and general mobile usage, an in-line "ear buds" headset with an input line (wire, cable, or other connector), mounted on or within the frame of eyeglasses, a near-to-eye (NTE) headset display or headset computing device, a long boom headset for very noisy environments such as industrial, military, and aviation applications as well as a gooseneck desktop-style microphone which can be used to provide theater or symphony-hall type quality acoustics without the structural costs.

While the invention has been described in terms of several embodiments, those of skill in the art will recognize that the invention is not limited to the embodiments described, but can be practiced with modification and alteration within the spirit and scope of the appended claims The description is thus to be regarded as illustrative instead of limiting.

What is claimed is:

1. A system to time delay a signal output from an analog-to-digital converter (ADC), comprising:
    a digital sensor responsive to an analog field quantity, the digital sensor is configured to output an oversampled digital output signal at a sampling clock frequency; and a time delay element, the time delay element is configured to receive as an input the oversampled digital output signal and to output a time delayed oversampled digital output signal.

2. The system of claim 1, further comprising:
a filter, the filter is configured to receive as an input the time delayed oversampled digital output signal, the filter to low pass filter and to decimate to a lower sample rate the time delayed oversampled digital output signal and to output a low pass filtered decimated delayed digital output signal, wherein the lower sample rate is less than the sampling clock frequency.

3. The system of claim 2, wherein the digital sensor utilizes a sigma-delta modulator and the oversampled digital output signal is a pulse density modulated (PDM) signal.

4. The system of claim 2, wherein the oversampled digital output signal is a pulse density modulated (PDM) signal.

5. The system of claim 2, wherein the digital sensor is a digital microphone.

6. The system of claim 5, wherein the digital microphone utilizes a micro-electromechanical systems (MEMS) sensor.

7. The system of claim 2, wherein the analog field quantity is an acoustic pressure field.

8. The system of claim 7, wherein a time delay applied by the time delay element is an integer number of sample clock cycles.

9. The system of claim 8, wherein the integer number of sampling clock cycles is selected from a range of one to the sampling clock frequency divided by a baseband sample rate.

10. The system of claim of claim 4, wherein the filter is a PDM receiver.

11. The system of claim 10, wherein the filter is a multistage filter further comprising:
a first stage, the first stage to low pass filter and to decimate to a first intermediate sampling rate the time delayed digital oversampled output signal; and
a second stage, wherein the second stage is configured to receive as an input an output from the first stage, the second stage to decimate the input to a baseband sample rate and to filter the input to a baseband signal bandwidth.

12. The system of claim 10, wherein the filter is a multistage filter further comprising:
a first stage, the first stage to receive as a first stage input signal the time delayed digital oversampled output signal, the first stage to low pass filter and to decimate to a first intermediate sampling rate the first stage input signal to form a first stage output signal;
a second stage, the second stage to receive as a second stage input signal the first stage output signal, the second stage to low pass filter and to decimate to a second intermediate sampling rate the second stage input signal to form a second stage output signal; and
a third stage, the third stage to receive as a third stage input signal the second stage output signal the third stage to decimate the third stage input signal to a baseband sample rate and to filter the third stage input signal to a baseband signal bandwidth, wherein the first intermediate sampling rate is less than the sampling clock frequency, the second intermediate sampling rate is less than the first intermediate sampling rate, and the baseband sampling rate is less that the second intermediate sampling rate.

13. The system of claim 9, wherein the lower sample rate is a baseband sample rate and the low pass filtered decimated time delayed digital output signal is used in a beamforming process with a second signal, wherein the second signal is a digital measurement of the field quantity.

14. The system of claim 13, wherein the time delay is added together with an integer delay before the beamforming process.

15. The system of claim 14, herein the integer delay is a number of cycles, of the lower sample rate.

16. A system to time delay a signal output from an analog-to-digital converter (ADC), comprising:
a sensor element, the sensor element is responsive to an analog field quantity:
a sigma-delta modulator, the sensor element is electrically coupled to the sigma-delta modulator and is configured to produce a pulse density modulated (PDM) output signal at a sampling clock frequency responsive to the analog field quantity; and
a time delay element, the time delay element is electrically configured to receive the PDM output signal, and to output a delayed PDM output signal, wherein the delayed PDM output signal is delayed by a time delay equal to a number of cycles of the sampling clock frequency.

17. The ADC system of claim 16, further comprising:
a decimation module, the decimation module is configured to receive as an input the delayed PDM output signal, the decimation module to low pass filter and to decimate to a lower sample rate the delayed PDM output signal and to output a low pass filtered decimated delayed PDM output signal, wherein the lower sample rate is less than the sampling clock frequency, the decimation module to convert to pulse code modulation (PCM) format.

18. The ADC system of claim 16, further comprising:
a decimation module the decimation module further comprising:
a first stage, the first stage to receive as a first stage input signal the delayed PDM output signal, the first stage to low pass filter and to decimate to a first intermediate sample rate the first stage input signal to form a first stage output signal, wherein the first intermediate sample rating is less than the sampling clock frequency; and
a second stage, the second stage to receive as a second stage input signal the first stage output signal, the second stage to low pass filter and to decimate to a lower sample rate the second stage input signal, wherein the lower sample rate is lower than the first intermediate sampling rate, the decimation module to convert to pulse code modulation (PCM) format.

19. The ADC system of claim 16, further comprising:
a decimation module, the decimation module further comprising:
a first stage, the first stage to receive as a first stage input signal the delayed PDM output signal, the first stage to low pass filter and to decimate to a first intermediate sample rate the first stage input signal to form a first stage output signal, wherein the first intermediate sample rating is less than the sampling clock frequency;
a second stage, the second stage to receive as a second stage input signal the first stage output signal, the second stage to low pass filter and to decimate to a second intermediate sample rate the second stage input signal, wherein the second intermediate sample rate is lower than the first intermediate sample rate; and a third stage, the third stage to receive as a third stage input signal the second stage output signal, the third stage to low pass filter and to decimate to a lower sample rate the second stage input signal, wherein the lower sample rate is lower than the second intermediate sample rate, the decimation module to convert to pulse code modulation (PCM) format.

20. The ADC system of claim 19, wherein the first stage employs a cascaded-integrator-comb (CIC) filter structure, the second stage is configured as two half-band filters, and the third stage is configured as a low pass filter.

21. The ADC system of claim 20, wherein the sampling clock frequency operates at 2.048 MHz, the first stage provides 8:1 decimation, the second stage provides two 2:1 half band decimation stages, the third stage provides 4:1 decimation which results in a baseband sampling rate of 16 kHz, low pass filtering throughout the decimation module filters high frequency components from the sigma-delta modulation process.

22. The ADC system of claim 21, wherein the sampling clock frequency is selected from the group consisting of 1 MHz to 4 MHz and a user defined sampling rate.

23. The ADC system of claim 22, wherein the digital sensor is a digital microphone and a field quantity is acoustic pressure.

24. The ADC system of claim 23, wherein the digital microphone utilizes a micro-electromechanical systems (MEMS) sensor.

25. The ADC system of claim 17, wherein the time delay element is a buffer, wherein a minimum length of the buffer is equal to the sampling clock frequency divided by the lower sample rate and the time delay is equal to a value of the buffer.

26. The ADC system of claim 25, wherein the time delay is programmable by specifying a value of the buffer.

27. The ADC system of claim 17, wherein the time delay element is implemented with a delay line.

28. The ADC of system of claim 27, where the time delay provided by the delay line is programmable.

29. The ADC system of claim 16, wherein the time delay is a fraction of a baseband sampling period.

30. The ADC system of claim 16, wherein the time delay is greater than a baseband sampling period.

31. A decimation module for use in an analog-to-digital converter (ADC) system, comprising:
a general number of N stages, the decimation module having as an input an oversampled digital output signal from a digital sensor;
an $i^{th}$ stage, the $i^{th}$ stage to low pass filter and to decimate to an $i^{th}$ intermediate sampling rate an $i^{th}$ stage input signal to form an $i^{th}$ stage output signal, wherein the $i^{th}$ intermediate sample rating is less than a sampling clock frequency used to create the oversampled digital output signal;
a time delay element, the time delay element to delay the $i^{th}$ stage output signal by a delay, wherein the delay is an integer number of $i^{th}$ intermediate sampling rate cycles the time delay element to output a delayed $i^{th}$ stage output signal; and
an i+1 stage, the i+1 stage to receive as an i+1 stage input signal the delayed $i^{th}$ stage output signal, the i+1 stage to low pass filter and to decimate to an i+1 intermediate sampling rate the i+1 stage input signal to form an i+1 stage output signal, wherein the i+1 intermediate sampling rate is lower than the intermediate sampling rate.

32. The decimation module of claim 31, wherein the digital sensor is a digital microphone and the delay is a time delay used during a beamforming operation with an output signal from the decimation module.

33. The decimation module of claim 31, wherein the digital sensor is a digital microphone and the delay is a fractional time delay which is combined with an integer time delay to form a combined time delay, wherein the combined time delay is used during a beamforming operation with an output signal from the decimation module.

34. A method to delay a signal output from an analog-to-digital converter (ADC), comprising:
sensing an analog field;
outputting an oversampled digital signal responsive to the sensing, wherein the oversampled digital signal is created at a sampling clock rate; and
delaying the oversampled digital signal by a time delay wherein the time delay is equal to an integer number of sampling clock cycles to produce a delayed oversampled digital signal.

35. The method of claim 34, further comprising:
applying a low pass filter with decimation to the delayed oversampled digital signal to output a baseband digital signal that is delayed by the time delay.

36. The method of claim 35, wherein the time delay is equal to a fraction of a baseband sampling period.

37. The method of claim 35, wherein the time delay is greater than a baseband sampling period.

38. The method of claim 35, wherein the oversampled digital signal is digitized to create samples which are more than one bit deep.

39. A non-transitory computer-readable storage medium storing program code for causing a data processing system to perform the steps comprising:
receiving signals from a digital sensor, the signals are responsive to an analog field;
processing the signals to create an oversampled digital signal responsive to the receiving, wherein the oversampled digital signal is created at a sampling clock rate; and
delaying the oversampled digital signal by a time delay wherein the time delay is equal to an integer number of sampling clock cycles to produce a delayed oversampled digital signal.

40. The non-transitory computer readable storage medium of claim 39, further comprising:
applying a low pass filter with decimation to the delayed oversampled digital signal to output a baseband digital signal that is delayed by the time delay.

41. The non-transitory computer readable storage medium of claim 40, wherein the time delay is equal to a fraction of a baseband sampling period.

42. The non-transitory computer readable storage medium of claim 40, wherein the time delay is greater than a baseband sampling period.

43. The non-transitory computer readable storage medium of claim 40, wherein the oversampled digital signal is digitized to create samples which are more than one bit deep.

44. A system to delay a signal output from an analog-to-digital converter (ADC), comprising:
sensing means for measuring an analog field quantity;
oversampling means, the oversampling means to oversample a signal detected by the sensing means resulting in an oversampled digital signal;
delaying means, the delaying means to apply a time delay to the oversampled digital signal, resulting in a delayed oversampled digital signal; and decimating means, the decimating means to receive the delayed oversampled digital signal and to low pass filter and to decimate to a lower sampling rate, wherein the resulting digital signal contains a digital representation of the analog field quantity without noise introduced by the oversampling means.

45. The system of claim 44, wherein the decimating means is accomplished in a multistage module.

46. The system of claim 44, wherein the time delay is equal to a fraction of a baseband sampling period.

47. The system of claim 44, wherein the time delay is greater than a baseband sampling period.

48. The system of claim 44, wherein the oversampled digital signal is digitized to create samples which are more than one bit deep.

49. A system to time delay a signal output from an analog-to-digital converter (ADC), comprising:
   a digital sensor responsive to an analog field quantity, the digital sensor configured to output an oversampled digital output signal at a sampling clock frequency;
   a replicator, the replicator to receive the oversampled digital output signal and to output a first replica of the oversampled digital output signal and a second replica of the oversampled digital output signal;
   a first time delay element, the first time delay element is configured to receive as an input the first replica and to output a first time delayed oversampled digital output signal; and
   a second time delay element, the second time delay element is configured to receive as an input the second replica and to output a second time delayed oversampled digital output signal.

50. The system of claim 49, wherein the replicator is a splitter.

51. The system of claim 50, wherein the splitter is an n-way splitter.

52. The system of claim 49, further comprising
   a first filter, the first filter is configured to receive as an input the first time delayed oversampled digital output signal, the first filter to low pass filter and to decimate to a lower sample rate the first time delayed oversampled digital output signal and to output a first low pass filtered decimated delayed digital output signal, wherein the lower sample rate is less than the sampling clock frequency; and
   a second filter, the second filter is configured to receive as an input the second time delayed oversampled digital output signal, the second filter to low pass filter and to decimate to a lower sample rate the second time delayed oversampled digital output signal and to output a second low pass filtered decimated delayed digital output signal.

53. The system of claim 52, wherein the first time delayed oversampled digital output signal and the second time delayed oversampled digital output signal are used for beamforming.

54. The system of claim 49, further comprising:
   a sigma-delta modulator, the digital sensor is electrically coupled to the sigma-delta modulator and is configured to produce a pulse density modulated (PDM) output signal at the sampling clock frequency responsive to the analog field quantity.

* * * * *